(12) United States Patent
Takabe et al.

(10) Patent No.: US 10,751,996 B2
(45) Date of Patent: Aug. 25, 2020

(54) PIEZOELECTRIC DEVICE, LIQUID EJECTING HEAD, AND LIQUID EJECTING APPARATUS

(71) Applicant: Seiko Epson Corporation, Tokyo (JP)

(72) Inventors: Motoki Takabe, Shiojiri (JP); Masao Nakayama, Shiojiri (JP); Takanori Aimono, Matsumoto (JP); Takashi Kasahara, Kodaira (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/262,014

(22) Filed: Jan. 30, 2019

(65) Prior Publication Data

US 2019/0232659 A1    Aug. 1, 2019

(30) Foreign Application Priority Data

Jan. 31, 2018 (JP) ................................. 2018-014563
Jun. 25, 2018 (JP) ................................. 2018-119537

(51) Int. Cl.
*B41J 2/14* (2006.01)
*H01L 41/00* (2013.01)
*H01L 41/053* (2006.01)

(52) U.S. Cl.
CPC .......... *B41J 2/14233* (2013.01); *H01L 41/00* (2013.01); *H01L 41/0533* (2013.01); *B41J 2/14274* (2013.01); *B41J 2002/14241* (2013.01); *B41J 2002/14491* (2013.01)

(58) Field of Classification Search
CPC .. H01L 41/00; H01L 41/0533; B41J 2/14201; B41J 2/14233; B41J 2002/14491; B41J 2002/14241; B41J 2/14274
See application file for complete search history.

(56) References Cited

U.S. PATENT DOCUMENTS

| 2008/0024563 | A1 | 1/2008 | Matsui et al. |
| 2011/0043573 | A1* | 2/2011 | Umeda .................... B41J 2/055 |
| | | | 347/68 |
| 2017/0217174 | A1 | 8/2017 | Tanaka et al. |

FOREIGN PATENT DOCUMENTS

| JP | 2005-278265 A | 10/2005 |
| JP | 2008-066623 A | 3/2008 |
| JP | 2009-214522 A | 9/2009 |
| JP | 2010-228268 A | 10/2010 |
| JP | 2017-132170 A | 8/2017 |

* cited by examiner

*Primary Examiner* — Geoffrey S Mruk
(74) *Attorney, Agent, or Firm* — Harness, Dickey & Pierce, P.L.C.

(57) ABSTRACT

A piezoelectric device includes in a piezoelectric layer, a recessed portion which is provided outside an active portion and opens on the side opposite to a substrate is provided, in a lamination direction of the substrate and a piezoelectric element, a first barrier layer formed of a material other than the zirconium oxide is formed in a region of a vibration plate opposite to the substrate and overlapping a bottom surface of the recessed portion, and the first barrier layer is not formed in a portion of a region overlapping the active portion in the lamination direction.

19 Claims, 12 Drawing Sheets

PIEZOELECTRIC DEVICE, LIQUID EJECTING HEAD, AND LIQUID EJECTING APPARATUS

The entire disclosure of Japanese Patent Application No. 2018-014563, filed Jan. 31, 2018 and 2018-119537, filed Jun. 25, 2018 are expressly incorporated by reference herein.

BACKGROUND

1. Technical Field

The present invention relates to a piezoelectric device, a liquid ejecting head including the piezoelectric device, and a liquid ejecting apparatus including the liquid ejecting head.

2. Related Art

In the related art, a liquid ejecting head that ejects a liquid droplet from a nozzle communicating with a pressure generating chamber by deforming a piezoelectric element to generate a pressure variation in a liquid in the pressure generating chamber is known. As a typical example thereof, there is an ink jet type recording head that ejects an ink droplet as a liquid droplet.

For example, the ink jet type recording head includes a piezoelectric element on one surface side of a flow path forming substrate provided with a pressure generating chamber communicating with a nozzle opening via a vibration plate, and deforms the vibration plate by driving the piezoelectric element to cause a pressure variation in the pressure generating chamber, thereby causing the ink droplet to be ejected from the nozzle.

Here, the piezoelectric element is formed of a first electrode, a piezoelectric layer, and a second electrode provided on the vibration plate including zirconium oxide as an uppermost layer (for example, refer to JP-A-2010-228268). In addition, in such a piezoelectric element, an active portion which is interposed between the first electrode and the second electrode and serves as a substantial driving portion is provided for each region facing the pressure generating chamber of the vibration plate. On both sides of the active portion in the region facing the pressure generating chamber, there is a region where the vibration plate or the vibration plate and an inactive portion of the piezoelectric element are laminated, which is called an arm portion. Furthermore, in such a piezoelectric element, by providing a recessed portion that opens on the side opposite to the substrate in the region corresponding to the arm portion of the piezoelectric layer, the displacement characteristic of the piezoelectric element can be improved, that is, displaced significantly at low voltage.

In addition, a piezoelectric element provided with a moisture barrier layer protecting a piezoelectric layer from moisture is proposed (for example, refer to JP-A-2008-066623).

However, by providing the recessed portion in the piezoelectric layer, since the vibration plate is exposed or is close to an external atmosphere, there is a problem that the zirconium oxide of the vibration plate and moisture react with each other in the high humidity environment and the characteristics of the vibration plate change.

In addition, although a configuration in which an inside of the recessed portion, particularly a bottom surface of the recessed portion, is covered with the second electrode is also disclosed, moisture permeates through the second electrode, and moisture permeated through the second electrode reacts with the zirconium oxide of the vibration plate, so that there is a problem that the characteristics of the vibration plate change.

In particular, in the ink jet type recording head having a configuration in which the second electrode is commonly provided across a plurality of the active portions as in JP-A-2010-228268, with the increase in the density of the active portion, a film thickness of the second electrode is thin, and moisture easily permeates through the second electrode, so that characteristics of the vibration plate are likely to change.

In addition, in JP-A-2008-066623, although the moisture barrier layer is provided in the piezoelectric element, there is a problem that the displacement amount of the piezoelectric element decreases since the moisture barrier layer is provided in the active portion region of the piezoelectric element.

Such a problem is not limited to the liquid ejecting head typified by the ink jet type recording head, and exists in other piezoelectric devices as well.

SUMMARY

An advantage of some aspects of the invention is to provide a piezoelectric device, a liquid ejecting head, and a liquid ejecting apparatus in which a characteristic of a vibration plate is inhibited from changing due to moisture without inhibiting deformation of a piezoelectric element.

According to an aspect of the invention, there is provided a piezoelectric device including a substrate on which a plurality of first recessed portions are formed, a vibration plate that is provided on one surface side of the substrate and has a zirconium oxide layer containing zirconium oxide as an uppermost layer on a side opposite to the substrate, and a piezoelectric element that has a first electrode provided on the one surface side of the substrate via the vibration plate, a piezoelectric layer provided on the first electrode, and a second electrode provided on the piezoelectric layer, in which in the piezoelectric element, an active portion of the piezoelectric layer interposed between the first electrode and the second electrode is provided independently for each of the first recessed portions, the first electrode forms an individual electrode provided independently for each of the active portions, the second electrode forms a common electrode commonly provided to a plurality of the active portions, in the piezoelectric layer, a second recessed portion which is provided outside the active portion and opens on the side opposite to the substrate is provided, in a lamination direction of the substrate and the piezoelectric element, a first moisture barrier layer formed of a material other than the zirconium oxide is formed in a region of the vibration plate opposite to the substrate and overlapping a bottom surface of the second recessed portion, and the first moisture barrier layer is not formed in a portion of a region overlapping the active portion in the lamination direction.

Furthermore, according to another aspect of the invention, there is provided a liquid ejecting head including the piezoelectric device described above.

In addition, according to still another aspect of the invention, there is provided a liquid ejecting apparatus including the liquid ejecting head described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail based on embodiments.

Embodiment 1

Figure 1:
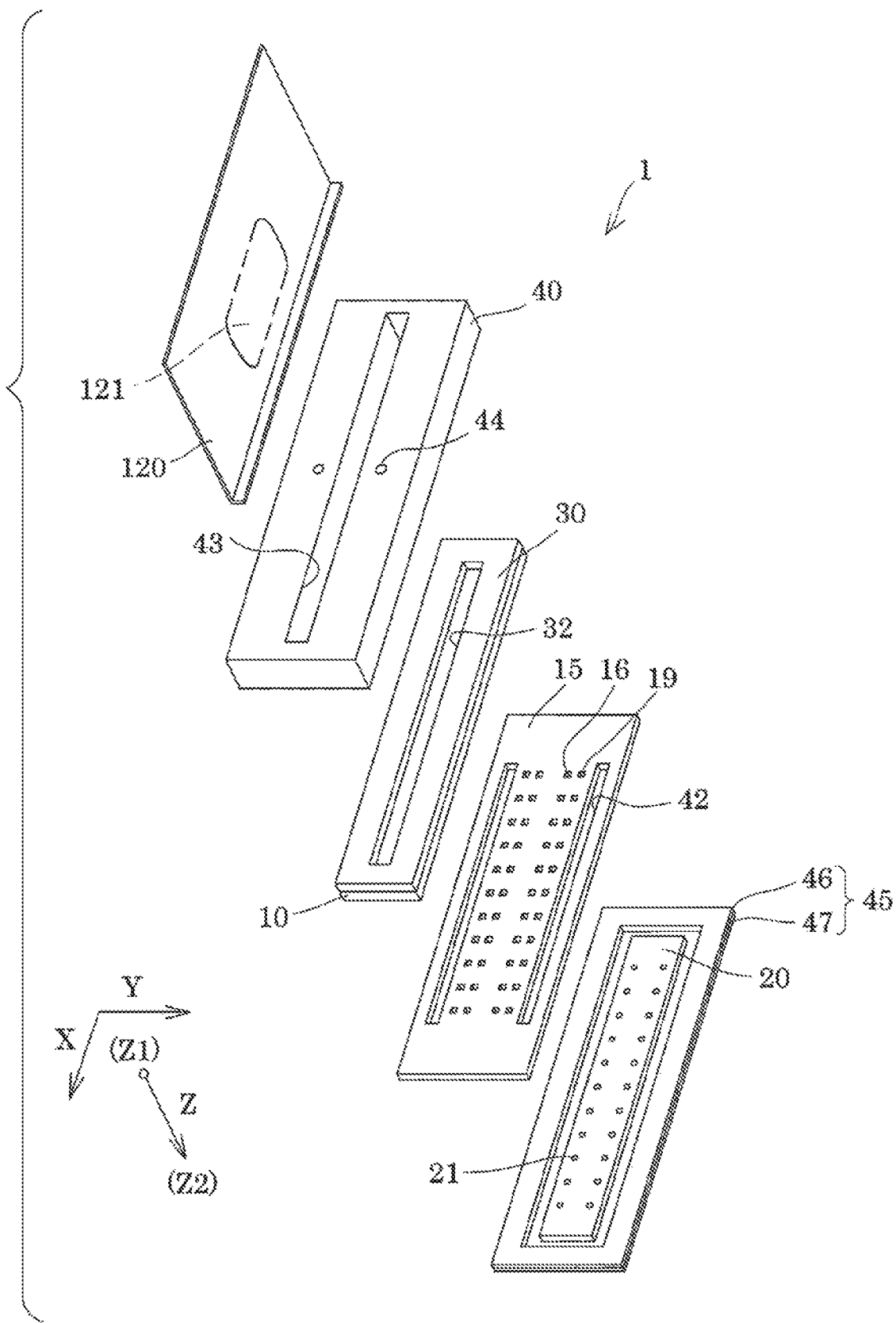
FIG. 1 is an exploded perspective view of a recording head according to Embodiment 1 of the invention.
Figure 2:
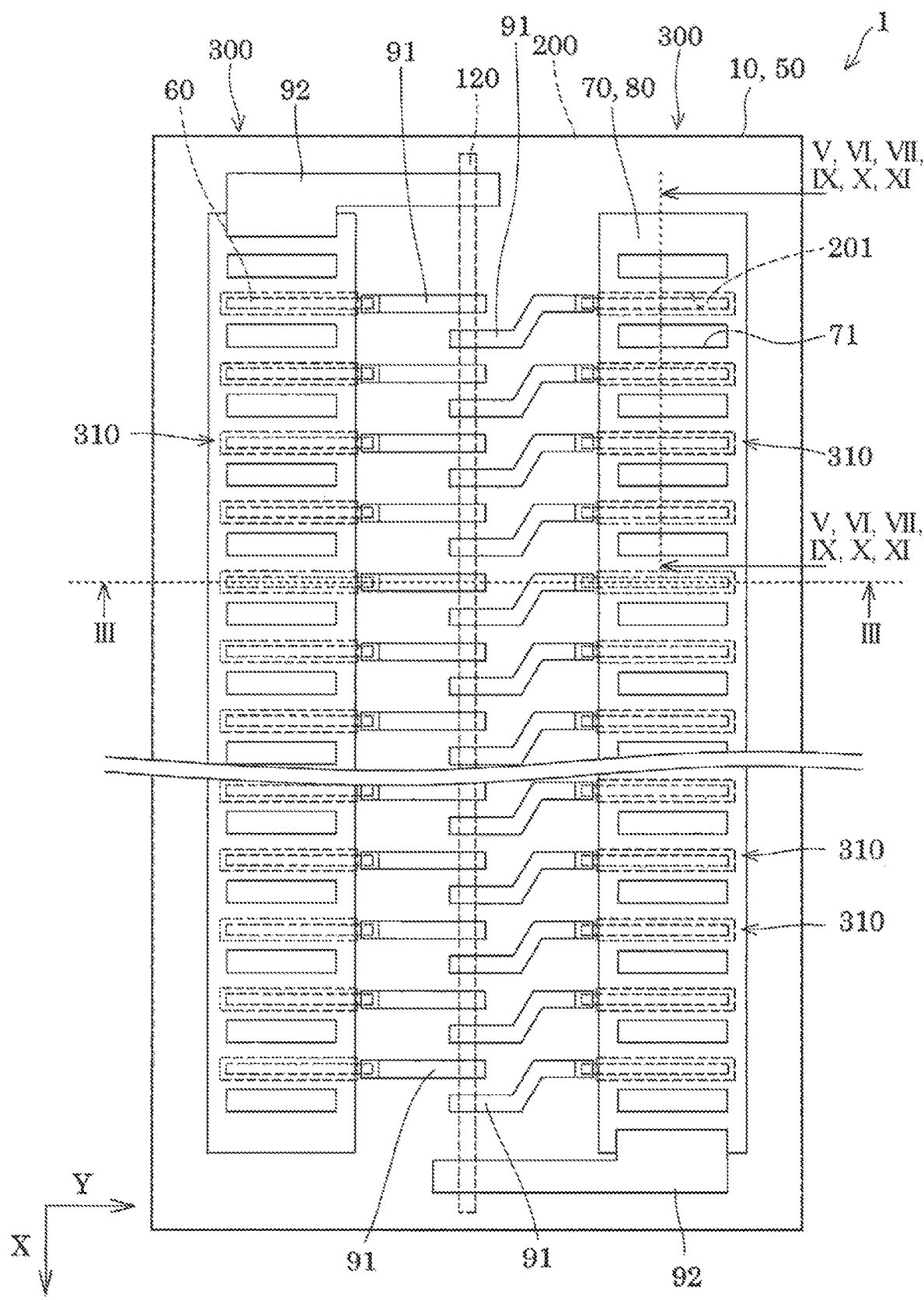
FIG. 2 is a plan view of a flow path forming substrate according to Embodiment 1 of the invention.
Figure 3:
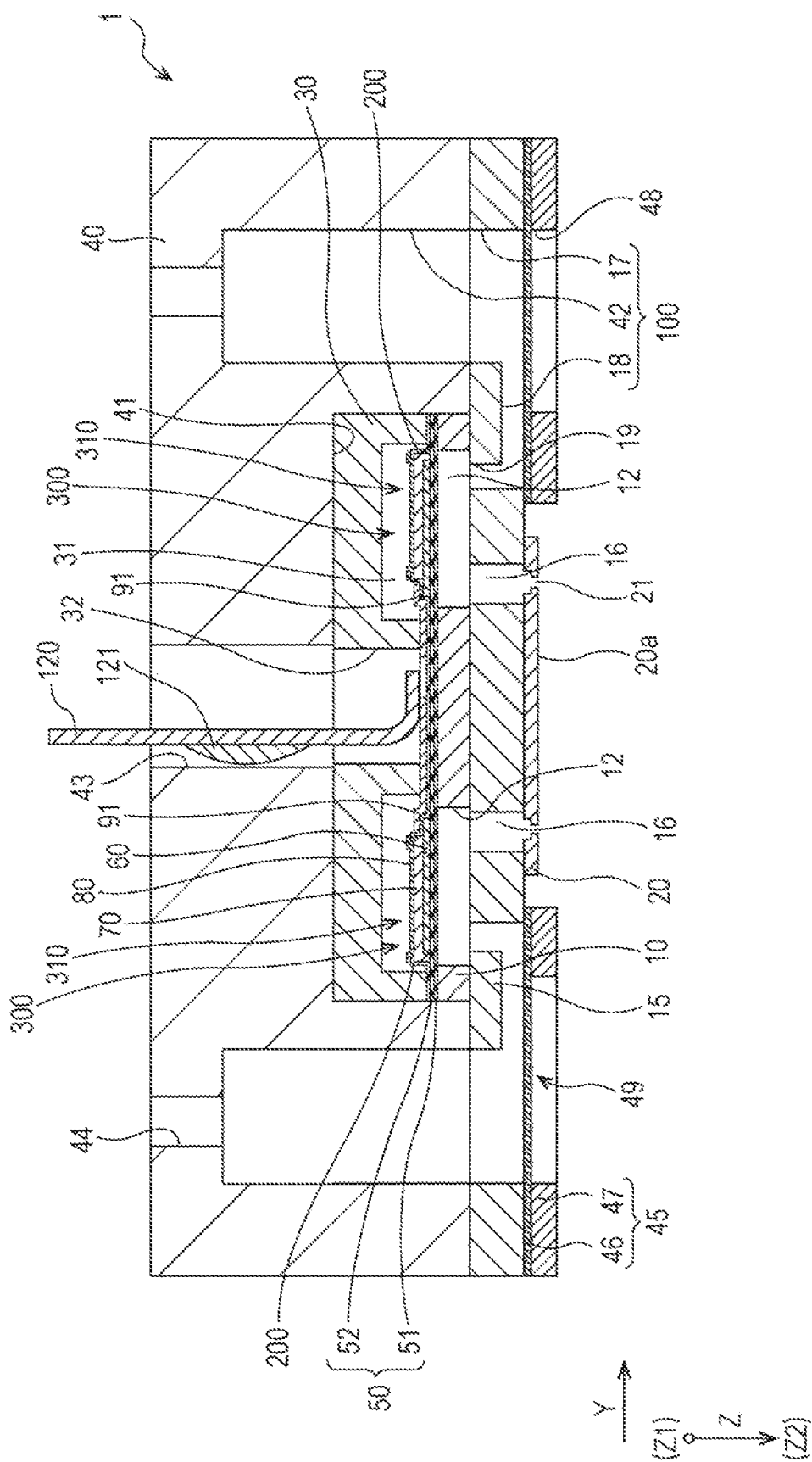
FIG. 3 is a cross-sectional view of the recording head according to Embodiment 1 of the invention.
Figure 4:
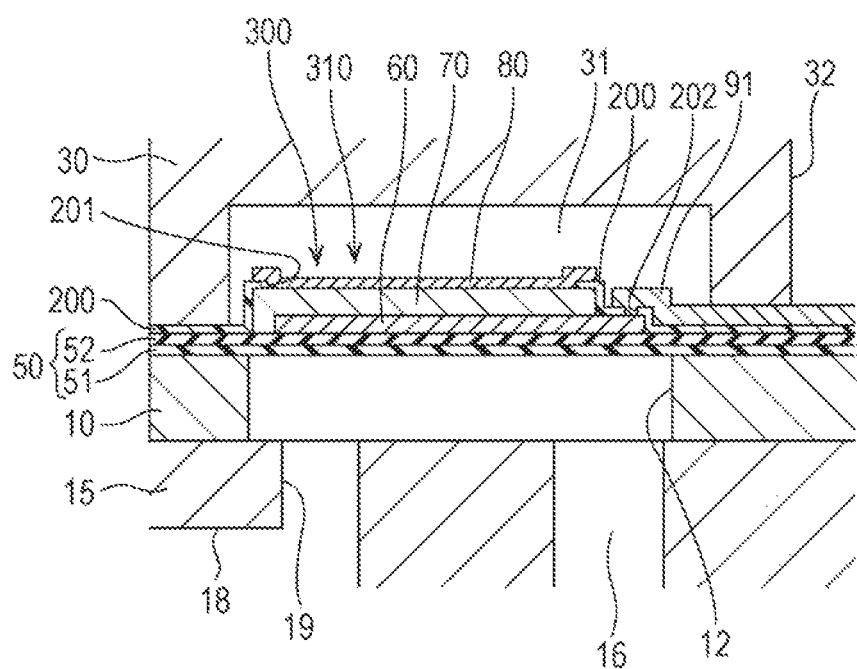
FIG. 4 is an enlarged cross-sectional view of a main part of the recording head according to Embodiment 1 of the invention.
Figure 5:
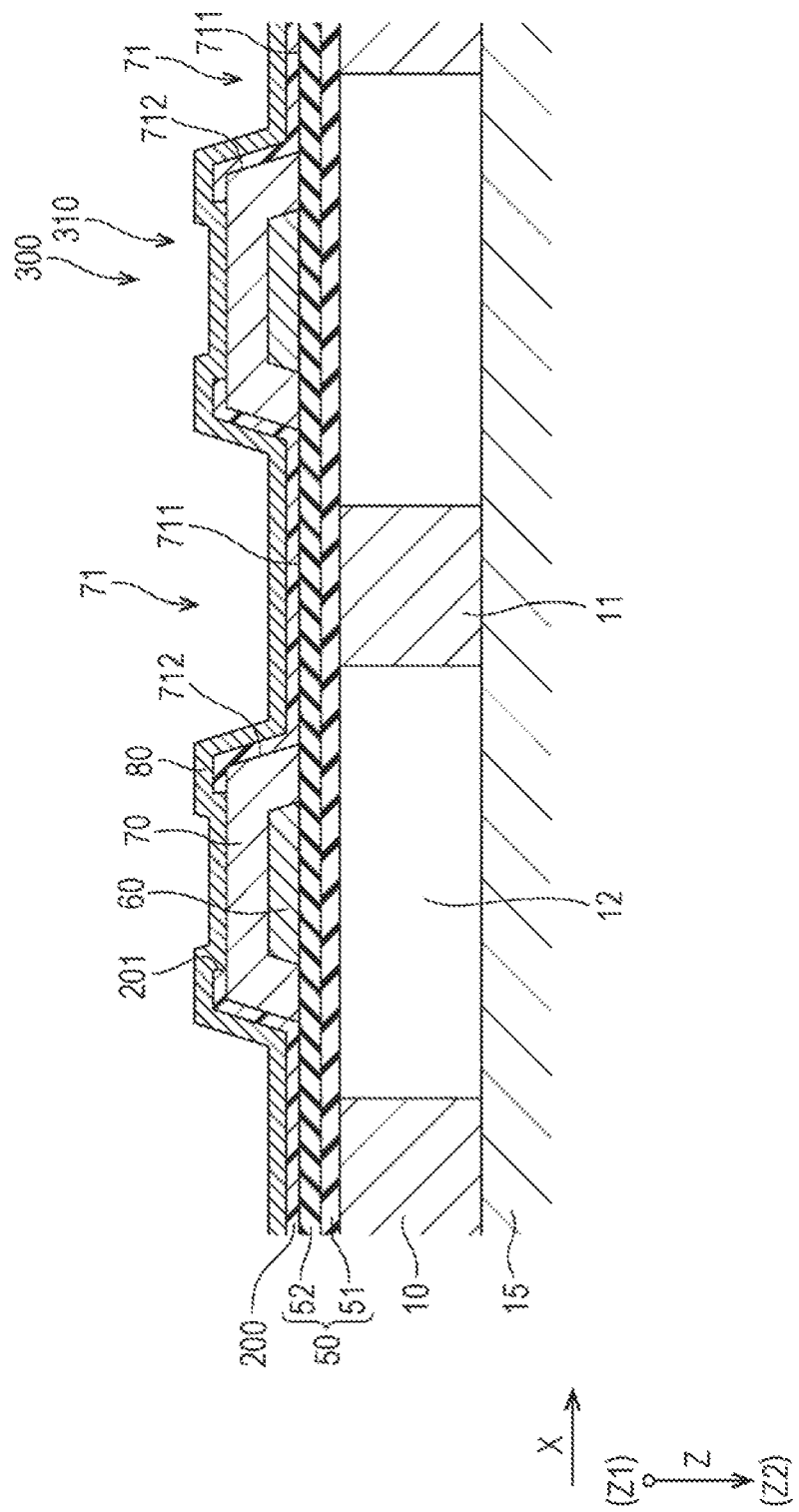
FIG. 5 is an enlarged cross-sectional view of a main part of the recording head according to Embodiment 1 of the invention.

FIG. 1 is an exploded perspective view of an ink jet type recording head as a liquid ejecting head according to Embodiment 1 of the invention. FIG. 2 is a plan view of a flow path forming substrate of a recording head. FIG. 3 is a cross-sectional view taken along line III-III in FIG. 2. FIG. 4 is an enlarged view of a main part of FIG. 3. FIG. 5 is a cross-sectional view taken along line V-V in FIG. 2.

As shown in the figure, as the flow path forming substrate 10 serving as the substrate forming the ink jet recording head 1 (hereinafter also simply referred to as recording head 1) of the embodiment, a metal such as stainless steel or Ni, a ceramic material typified by $ZrO_2$ or $Al_2O_3$, a glass ceramic material, an oxide such as MgO, $LaAlO_3$ can be used. In the embodiment, the flow path forming substrate 10 is made of a silicon single crystal substrate. On the flow path forming substrate 10, by performing anisotropic etching from one surface side, the pressure generating chambers 12 serving as first recessed portions partitioned by a plurality of partition walls 11 are disposed in parallel along the direction where the plurality of nozzles 21 discharging ink are disposed in parallel. Hereinafter, this direction is referred to as a parallel arrangement direction of the pressure generating chambers 12 or a first direction X. In addition, in the flow path forming substrate 10, a plurality of rows in which the pressure generating chambers 12 are disposed in parallel in the first direction X are provided, and two rows are provided in this embodiment. The arrangement direction in which a plurality of rows of the pressure generating chambers 12 are provided is hereinafter referred to as a second direction Y. An arrangement direction where the plurality of the rows of the pressure generating chambers are provided is hereinafter referred to as a second direction Y. In the embodiment, a portion between the pressure generating chambers 12 disposed in parallel in the first direction X of the flow path forming substrate 10 is referred to as a partition wall 11. The partition wall 11 is formed along the second direction Y. That is, the partition wall 11 is referred to as a portion that overlaps the pressure generating chamber 12 in the second direction Y of the flow path forming substrate 10. Furthermore, a direction orthogonal to both the first direction X and the second direction Y is referred to as a third direction Z. A side of a case member 40 to be described in detail later is referred to as a Z1 side, and a side of a nozzle plate 20 as a Z2 side. Although the first direction X, the second direction Y, and the third direction Z are orthogonal to each other, the directions are not particularly limited thereto, and may be directions intersecting at an angle other than orthogonal to each other.

A communicating plate 15 and the nozzle plate 20 are sequentially laminated on the Z2 side serving as one surface side of such a flow path forming substrate 10.

As shown in FIG. 3, the communicating plate 15 is provided with a nozzle communicating path 16 communicating the pressure generating chamber 12 and the nozzle 21. The communicating plate 15 has an area larger than that of the flow path forming substrate 10 and the nozzle plate 20 has an area smaller than that of the flow path forming substrate 10. Since the nozzle 21 of the nozzle plate 20 and the pressure generating chamber 12 are separated from each other by providing the communicating plate 15 as described above, the ink in the pressure generating chamber 12 is unlikely to be affected by thickening due to evaporation of moisture in the ink caused by ink near the nozzle 21. In addition, since the nozzle plate 20 need only cover an opening of the nozzle communicating path 16 communicating the pressure generating chamber 12 and the nozzle 21, the area of the nozzle plate 20 can be made comparatively small and the cost can be reduced. In the embodiment, a surface of the nozzle plate 20 where the nozzle 21 is opened and the ink droplet is discharged is referred to as a liquid ejecting surface 20a.

In addition, the communicating plate 15 is provided with a first manifold portion 17 and a second manifold portion 18 which form a portion of a manifold 100.

The first manifold portion 17 is provided so as to penetrate the communicating plate 15 in the third direction Z.

The second manifold portion 18 is provided so as to open on the nozzle plate 20 side of the communicating plate 15 without penetrating the communicating plate 15 in the third direction Z.

In addition, a supply communicating path 19 communicating with one end portion of the pressure generating chamber 12 in the second direction Y is provided in the communicating plate 15 independently for each of the pressure generating chambers 12. The supply communicating path 19 communicates the second manifold portion 18 and the pressure generating chamber 12 and supplies the ink in the manifold 100 to the pressure generating chamber 12.

As such a communicating plate 15, a metal such as stainless steel or nickel (Ni), ceramics such as zirconium (Zr) can be used. The communicating plate 15 is preferably made of a material having the same coefficient of linear expansion as that of the flow path forming substrate 10. That is, in a case where the communicating plate 15 is made of a material having a significantly different coefficient of linear expansion from the flow path forming substrate 10, by being heated or cooled, warpage occurs due to a difference in coefficient of linear expansion between the flow path forming substrate 10 and the communicating plate 15. In the embodiment, by using the same material as the flow path forming substrate 10 as the communicating plate 15, that is, a silicon single crystal substrate, it is possible to inhibit the occurrence of warpage due to heat, or cracks, separation, or the like due to heat.

The nozzle 21 communicating with each pressure generating chamber 12 via the nozzle communicating path 16 is formed in the nozzle plate 20. That is, in the nozzles 21, nozzles for ejecting the same type of liquid (ink) are disposed in parallel in the first direction X, and two rows of the nozzles 21 disposed in parallel in the first direction X are formed in the second direction Y.

As such a nozzle plate 20, for example, a metal such as stainless steel (SUS), an organic material such as a polyimide resin, a silicon single crystal substrate can be used. By using the silicon single crystal substrate as the nozzle plate 20, the coefficient of linear expansion between the nozzle plate 20 and the communicating plate 15 is made equal, and it is possible to inhibit the occurrence of cracks, separation, or the like due to warpage or heat by being heated or cooled.

On the other hand, a vibration plate 50 is formed on the Z1 side serving as the other side of the flow path forming substrate 10. The vibration plate 50 has a zirconium oxide layer 52 containing zirconium oxide ($ZrO_X$) as the uppermost layer on the side opposite to the flow path forming substrate 10. In the embodiment, the vibration plate 50 is provided with an elastic film 51 containing silicon oxide ($SiO_X$) provided on the flow path forming substrate 10 side, and the zirconium oxide layer 52 containing the zirconium oxide ($ZrO_X$) provided on the elastic film 51, that is, on the side of the elastic film 51 opposite to the flow path forming substrate 10. In the embodiment, the elastic film 51 containing silicon dioxide ($SiO_2$) and the zirconium oxide layer 52 containing the zirconium oxide ($ZrO_2$) are used. Here, the zirconium oxide layer 52 may contain other materials as long as the zirconium oxide layer 52 contains the zirconium oxide as a main component. The fact that the main component of the zirconium oxide layer is the zirconium oxide means that the zirconium oxide contained in the zirconium oxide layer 52 is 50% or more by mass. In addition, in the embodiment, although the elastic film 51 containing the silicon oxide is provided as the vibration plate 50, the material of the elastic film 51 is not limited to the silicon oxide, and may be titanium oxide or the like. In addition, the elastic film 51 may not be provided on the vibration plate 50. That is, the vibration plate 50 may be formed of only the zirconium oxide layer 52. By using the zirconium oxide layer 52 containing the zirconium oxide for the vibration plate 50 as described above, rigidity and toughness of the vibration plate 50 can be ensured. In addition, the zirconium oxide layer 52 containing the zirconium oxide as the uppermost layer of the vibration plate 50 on the side opposite to the flow path forming substrate 10 is used. Accordingly, it is possible to inhibit a component such as lead (Pb) and bismuth (Bi) contained in a piezoelectric layer 70 to be described in detail from diffusing below the zirconium oxide layer 52, that is, to the elastic film 51 or the flow path forming substrate 10. That is, the zirconium oxide layer 52 containing the zirconium oxide as the uppermost layer of the vibration plate 50 is provided. Accordingly, it is possible to inhibit diffusion of components contained in the piezoelectric layer 70 to the elastic film 51 or the flow path forming substrate 10, and to inhibit problems such as reduction in rigidity due to diffusion of components of the piezoelectric layer 70 to the elastic film 51, the flow path forming substrate 10, or the like.

The liquid flow path such as the pressure generating chamber 12 is formed by performing anisotropic etching on the flow path forming substrate 10 from one surface side (surface side to which nozzle plate 20 is bonded), and the other surface of the pressure generating chamber 12 is defined by the elastic film 51. That is, the elastic film 51 containing the silicon oxide is provided on the flow path forming substrate 10 side of the vibration plate 50. Accordingly, the elastic film 51 can be used as an etching stop layer when performing anisotropic etching on the flow path forming substrate 10 using the alkaline solution such as KOH from the side opposite to the vibration plate 50. Therefore, it is possible to form the pressure generating chambers 12 with high density and high precision by anisotropic etching on the flow path forming substrate 10, and to inhibit variations in the thickness of the vibration plate 50. It goes without saying that the method of forming the pressure generating chamber 12 is not limited to anisotropic etching, and dry etching or the like may be used.

In addition, as shown in FIGS. 4 and 5, on the vibration plate 50 of the flow path forming substrate 10, a piezoelectric actuator 300 including a first electrode 60, the piezoelectric layer 70, and a second electrode 80 is formed. In the embodiment, the piezoelectric actuator 300 serves as a pressure generating means for causing pressure change in the ink in the pressure generating chamber 12. Here, the piezoelectric actuator 300 is also referred to as a piezoelectric element 300, and is a portion including the first electrode 60, the piezoelectric layer 70, and the second electrode 80. In addition, a portion where piezoelectric strain occurs in the piezoelectric layer 70 when a voltage is applied between the first electrode 60 and the second electrode 80 is referred to as an active portion 310. That is, the active portion 310 is referred to as a portion where the piezoelectric layer 70 is interposed between the first electrode 60 and the second electrode 80 in the third direction Z. In the embodiment, the active portion 310 is formed for each pressure generating chamber 12 serving as the first recessed portion. In the embodiment, the first electrode 60 forms an individual electrode independently provided for each of the active portions 310, and the second electrode 80 forms a common electrode which is commonly provided for the plurality of the active portions 310.

Here, the first electrode 60 forming the piezoelectric actuator 300 of the embodiment is separated for each pressure generating chamber 12 and forms an independent individual electrode for each active portion 310 serving as a substantial driving portion of the piezoelectric actuator 300. The first electrode 60 is formed with a width narrower than the width of the pressure generating chamber 12 in the first direction X serving as the parallel arrangement direction of the active portions 310. That is, in the first direction X of the pressure generating chamber 12, the end portion of the first electrode 60 is located inside the region facing the pressure generating chamber 12. As will be described in detail later, since the second electrode 80 is wider than the first electrode 60 in the first direction X, the width of the active portion 310 in the first direction X according to the embodiment is defined by the first electrode 60.

The material of the first electrode 60 is required to be a material that does not oxidize and can maintain conductivity when the piezoelectric layer 70 described later is formed, and for example, a noble metal such as platinum (Pt), iridium (Ir), or a conductive oxide typified by lanthanum nickel oxide (LNO) or the like is preferably used.

In addition, as the first electrode 60, an adhesion layer for ensuring adhesion strength between the above-described conductive material and the vibration plate 50 may be used. In the embodiment, although not shown, titanium is used as the adhesion layer. As the adhesion layer, zirconium, titanium, titanium oxide, or the like can be used. That is, in the embodiment, the first electrode 60 is formed of an adhesion layer made of titanium and at least one conductive layer selected from the above-described conductive materials.

As shown in FIG. 4, the piezoelectric layer 70 is provided continuously in the first direction X so that the second direction Y has a predetermined width.

In the second direction Y of the pressure generating chamber 12, the end portion of the piezoelectric layer 70 on the supply communicating path 19 side is located outside the end portion of the first electrode 60. That is, the end portion of the first electrode 60 is covered with the piezoelectric layer 70. In addition, in the second direction Y, the end portion of the piezoelectric layer 70 on the nozzle side is located inside the end portion of the first electrode 60 (pressure generating chamber 12 side), and the end portion of the first electrode 60 on the nozzle 21 side is not covered with the piezoelectric layer 70.

The piezoelectric layer 70 is made of an oxide piezoelectric material having a polarization structure formed on the first electrode 60, for example, can be made of a perovskite type oxide represented by the general formula $ABO_3$, and a lead-based piezoelectric material containing lead or a lead-free piezoelectric material containing no lead can be used. The piezoelectric layer 70 can be formed by, for example, a liquid phase method such as a sol-gel method, a metal-organic decomposition (MOD) method, and a physical vapor deposition (PVD) method (gas phase method) such as a sputtering method, a laser ablation method.

In such a piezoelectric layer 70, as shown in FIG. 5, a second recessed portion 71 is formed outside the active portion 310 and opens on the side opposite to the flow path forming substrate 10. That is, since the active portion 310 of the embodiment is defined by the first electrode 60 in the first direction X, the second recessed portion 71 is provided outside the first electrode 60 in the first direction X. In addition, since the active portions 310 are disposed in parallel in the first direction X, the second recessed portion 71 is disposed between the active portions 310 adjacent to each other in the first direction X.

In addition, in the embodiment, the second recessed portion 71 is provided so as to penetrate the piezoelectric layer 70 in the third direction Z serving as a lamination direction. That is, the second recessed portion 71 is formed to have a depth reaching the vibration plate 50, the piezoelectric layer 70 is not formed on a bottom surface 711 of the second recessed portion 71, and the vibration plate 50 is exposed on the bottom surface 711 of the second recessed portion 71.

Here, the second recessed portion 71 and the pressure generating chamber 12 serving as the first recessed portion are disposed on at least a position where a portion thereof overlaps each other in the third direction Z serving as the lamination direction of the flow path forming substrate 10 and the piezoelectric element 300. In addition, the width of the second recessed portion 71 in the first direction X is preferably substantially equal to or larger than the width of each partition wall 11 in the first direction X. Here, the width of the second recessed portion 71 in the first direction X is the width closest to the pressure generating chamber 12 side serving as the first recessed portion in the third direction Z, that is, the width of the bottom surface side of the second recessed portion 71. In addition, in the first direction X, the width of the pressure generating chamber 12 serving as the first recessed portion is referred to as a width closest to the second recessed portion 71 side in the third direction Z, that is, the width on the bottom surface side.

Incidentally, the fact that the pressure generating chamber 12 serving as the first recessed portion and the second recessed portion 71 are disposed on at least a position partially overlapping each other in the third direction Z include those in which the bottom surface sides defining the width of the pressure generating chamber 12 and the second recessed portion 71 do not overlap each other. That is, for example, if a side surface of the pressure generating chamber 12 and a side surface of the second recessed portion 71 are inclined, even if the bottom surfaces do not overlap each other, it is also possible to dispose so that the opening sides partially overlap each other.

By providing the second recessed portion 71 in the piezoelectric layer 70 in this manner, the rigidity of an arm portion between the wall surface of the vibration plate 50 and the pressure generating chamber 12 of the piezoelectric element 300 and the active portion 310 can be reduced, and the piezoelectric element 300 can be satisfactorily displaced.

The width of the second recessed portion 71 in the first direction X is substantially the same as or wider than the width of each partition wall 11 in the first direction X, that is, the bottom surface side defining the width in the first direction X of the pressure generating chamber 12 and the second recessed portion 71 is disposed on at least a position partially overlapping each other in the third direction Z. Accordingly, the thickness of the film forming the arm portion in the third direction Z can be reduced, and the displacement characteristic of the piezoelectric element 300 can be improved, that is, a high displacement can be obtained with a low voltage.

The second electrode 80 is provided on the side of the piezoelectric layer 70 opposite to the first electrode 60 and forms a common electrode common to the plurality of the active portions 310. In addition, the second electrode 80 is provided continuously over the inner surface of the second recessed portion 71, that is, the bottom surface of the second recessed portion 71 on the flow path forming substrate 10 side and the side surface on the piezoelectric layer 70 side. The second electrode 80 may not be provided on the inner surface of the second recessed portion 71.

Such a second electrode 80 is desirably a material that can form an interface of the piezoelectric layer 70 satisfactorily, and can exhibit conductivity and piezoelectric characteristics. A noble metal material such as iridium (Ir), platinum (Pt), palladium (Pd), gold (Au), or a conductive oxide typified by lanthanum nickel oxide (LNO) is preferably used. In addition, the second electrode 80 may be a lamination of a plurality of materials. In the embodiment, a laminated electrode of iridium and titanium (iridium is in contact with piezoelectric layer 70) is used. The second electrode 80 can be formed by, for example, a physical vapor deposition (PVD) method (gas phase method) such as a sputtering method, a laser ablation method, and a liquid phase method such as a sol-gel method, a metal-organic decomposition (MOD) method, plating method. In addition, by performing heat treatment after forming the second electrode 80, characteristics of the piezoelectric layer 70 can be improved.

In addition, in the third direction Z, in a region of the vibration plate 50 opposite to the flow path forming substrate 10 and overlapping the bottom surface 711 of the second recessed portion 71 of the piezoelectric layer 70, a first moisture barrier layer 200 formed of a material different from that of the second electrode 80 is provided. Here, the fact that the first moisture barrier layer 200 is provided on the side of the vibration plate 50 opposite to the flow path forming substrate 10 in the third direction Z means that the first moisture barrier layer 200 is provided on the Z1 side of the vibration plate 50 in the third direction Z. In the embodiment, the first moisture barrier layer 200 is provided between the vibration plate 50 and the second electrode 80. That is, since the second recessed portion 71 penetrates the piezoelectric layer 70 in the third direction Z, the vibration plate 50, the first moisture barrier layer 200, and the second electrode 80 are laminated in this order on the bottom surface 711 of the second recessed portion 71 from the flow path forming substrate 10 side.

The bottom surface 711 of the second recessed portion 71 is referred to as the inner surface of the second recessed portion 71 closest to the flow path forming substrate 10 side in the third direction Z. In addition, the fact that the first moisture barrier layer 200 is provided in a region overlapping the bottom surface 711 of the second recessed portion 71 means that the first moisture barrier layer 200 overlaps the entire bottom surface 711 of the second recessed portion 71, in plan view from the third direction Z. In addition, the fact that the first moisture barrier layer 200 is provided in the region overlapping the bottom surface 711 of the second recessed portion 71 means that the first moisture barrier layer 200 overlaps at least the bottom surface 711 of the second recessed portion 71. That is, the fact that the first moisture barrier layer 200 extends from the region overlapping the bottom surface 711 of the second recessed portion 71 to a region outside thereof is included. In the embodiment, the first moisture barrier layer 200 extends from a region overlapping the bottom surface 711 of the second recessed portion 71 toward the active portion 310 side. A portion of the first moisture barrier layer 200 extending from the bottom surface 711 of the second recessed portion 71 toward the active portion 310 is provided between the piezoelectric layer 70 and the second electrode 80 in the embodiment. That is, a portion of the first moisture barrier layer 200 extending from the bottom surface 711 of the second recessed portion 71 toward the active portion 310 is provided on the side surface 712 of the second recessed portion 71. In addition, a portion of the first moisture barrier layer 200 extending from the bottom surface 711 of the second recessed portion 71 toward the active portion 310 extends to reach the surface on the Z1 side of the piezoelectric layer 70. The first moisture barrier layer 200 is continuously provided over the inner surface of the second recessed portion 71 and an opening peripheral portion where the second recessed portion 71 of the piezoelectric layer 70 is opened.

In addition, the first moisture barrier layer 200 is not provided in a portion of the region overlapping the active portion 310 in the third direction Z. That is, the first moisture barrier layer 200 is not provided in the entire or a portion of the region overlapping the active portion 310 in the third direction Z. In the embodiment, the first moisture barrier layer 200 does not extend to the region overlapping the active portion 310 in the third direction Z, and is not provided in the entire region overlapping the active portion 310. Therefore, in the cross section of the first moisture barrier layer 200 in the first direction X, the end portion is located outside the active portion 310 on the Z1 side surface of the piezoelectric layer 70. That is, as shown in FIG. 2, the first moisture barrier layer 200 has an opening portion 201 larger than the active portion 310. In other words, an opening portion 201 of the first moisture barrier layer 200 is provided in a size and at a position enclosing the active portion 310 in the third direction Z.

In this manner, the first moisture barrier layer 200 is extended to the surface on which the second recessed portion 71 of the piezoelectric layer 70 opens, and the opening portion 201 that opens on the Z1 side surface of the piezoelectric layer 70 is provided. Accordingly, since the first moisture barrier layer 200 can be patterned on the plane of the Z1 side of the piezoelectric layer 70 when forming and patterning the first moisture barrier layer 200, it is possible to improve the patterning accuracy and to inhibit variations in displacement characteristics of the piezoelectric element 300 due to positional deviation of the opening portion 201. It goes without saying that the first moisture barrier layer 200 may be provided in a region overlapping the bottom surface 711 of the second recessed portion 71. The first moisture barrier layer 200 may be provided only on the bottom surface 711 of the second recessed portion 71. In addition, the first moisture barrier layer 200 may be opened in the middle of the bottom surface of the second recessed portion 71 and the bottom surface 711 side of the side surface 712, that is, the opening portion 201 may be opened in the middle of the side surface 712 of the second recessed portion 71.

In a case where a material having conductivity is used as the material of the first moisture barrier layer 200, it is preferable that the first moisture barrier layer 200 be provided in a portion formed outside the piezoelectric layer of the first electrode 60 serving as the individual electrode, and in a portion where the individual wiring 91 connected to the first electrode 60 is formed in the region not overlapping in the third direction Z. As a result, it is possible to inhibit the first electrodes 60 from being short-circuited by the first moisture barrier layer 200. In addition, in a case where an insulating material is used as the material of the first moisture barrier layer 200, the first moisture barrier layer 200 may be provided in a portion formed outside the piezoelectric layer 70 of the first electrode 60 or in a region overlapping the individual wiring 91 in the third direction Z.

As the material of such a first moisture barrier layer 200, any material other than the zirconium oxide may be used, and an inorganic material, an organic material, or the like can be used. In addition, the first moisture barrier layer 200 may be made of a material having conductivity or may be a material having insulating properties. Incidentally, in a case of a material having conductivity typified by a metal or the like, the electric resistance value of the second electrode 80 is reduced to inhibit the voltage drop in the first direction X as the parallel arrangement direction of the active portions 310 of the second electrode 80, and the occurrence of variations in the displacement of the active portion 310 can be inhibited.

Here, examples of the inorganic material usable as the first moisture barrier layer 200 include at least one selected from a metal, an oxide film, and a nitride film. That is, the first moisture barrier layer 200 may be formed of a single inorganic material, or may be formed by laminating different materials. In addition, as the inorganic material of the first moisture barrier layer 200, it is particularly preferable to use an inorganic amorphous material, that is, an amorphous oxide film and a nitride film. Examples of such an amorphous oxide film include aluminum oxide ($AlO_x$), for example, alumina ($Al_2O_3$). As described above, the amorphous oxide film and the nitride film are used as the first moisture barrier layer 200. Accordingly, permeation of moisture can be reliably inhibited, and the mechanical strength can be improved to inhibit occurrence of breakage such as cracks.

Here, the water vapor permeability of the silicon oxide ($SiO_2$) and aluminum oxide ($Al_2O_3$) which are representative examples of the oxide film are shown in the following Table 1.

TABLE 1

| Material | Film thickness [μm] | Water vapor permeability [$g/m^2 \cdot day$] |
|---|---|---|
| $SiO_2$ | 0.1 | 0.6 |
| $Al_2O_3$ | 0.1 | $1.0 \times 10^{-2}$ |

As shown in Table 1, aluminum oxide ($Al_2O_3$) is superior to the silicon oxide ($SiO_2$) in moisture barrier property between the silicon oxide ($SiO_2$) and aluminum oxide ($Al_2O_3$). Therefore, in a case where an inorganic material is used as the first moisture barrier layer 200, by using aluminum oxide ($Al_2O_3$), moisture permeation of the first moisture barrier layer 200 can be inhibited and the zirconium oxide layer 52 can be protected from moisture.

In addition, in a case where a metal is used as the first moisture barrier layer 200, by performing an annealing treatment after the film formation, formation of pinholes and the like can be inhibited to improve the moisture barrier property.

In addition, examples of the organic material usable as the first moisture barrier layer 200 include at least one selected from an epoxy resin, a polyimide resin, a silicon resin, and a fluorine resin. In addition, the first moisture barrier layer 200 may be formed of either one of an inorganic material and an organic material, or both of these may be laminated.

In this manner, the first moisture barrier layer 200 is provided so as to overlap at least the bottom surface 711 of the second recessed portion 71. Accordingly, even if the zirconium oxide layer 52 of the vibration plate 50 is disposed at a position close to the external atmosphere by the second recessed portion 71, the zirconium oxide layer 52 can be protected from moisture contained in the atmosphere by the first moisture barrier layer 200. Therefore, by providing the first moisture barrier layer 200, it is possible to inhibit the zirconium oxide layer 52 and moisture from reacting to change the characteristics of the zirconium oxide layer 52 and to inhibit the breakage of the vibration plate 50. Incidentally, in a case where the first moisture barrier layer 200 is not provided, the vibration plate 50 brakes under a high humidity environment or the like. This is because the characteristics of the zirconium oxide layer 52 are changed by the reaction between the zirconium oxide layer 52 and moisture, the zirconium oxide layer 52 and the second electrode 80 are separated so that the arm portion fixing the active portion 310 is formed only of the vibration plate 50, and the tensile stress due to the displacement of the active portion 310 is applied to the vibration plate 50. In addition, this is because that the toughness of the zirconium oxide layer 52 is reduced by the reaction between the zirconium oxide layer 52 and moisture. Therefore, in the embodiment, by providing the first moisture barrier layer 200, it is possible to inhibit the reaction between the zirconium oxide layer 52 and moisture, which causes breakage of the vibration plate 50, and to inhibit the breakage of the vibration plate 50 under a high humidity environment or the like.

In addition, in the embodiment, the first moisture barrier layer 200 is not provided on at least a portion of the region overlapping the active portion 310 in the third direction Z. Accordingly, it is possible to inhibit the active portion 310 from being constrained by the first moisture barrier layer 200 and to inhibit a decrease in the displacement amount of the active portion 310.

In the embodiment, the flow path forming substrate 10, which is the substrate on which the pressure generating chambers 12 as the first recessed portion is formed, the vibration plate 50, the first electrode 60, the piezoelectric layer 70, the second electrode 80, and the piezoelectric element 300 having the second recessed portion 71 formed therein are collectively referred to as a piezoelectric device.

In addition, as shown in FIG. 2, from the first electrode 60 of the piezoelectric actuator 300, the individual wiring 91 as a lead wiring is led out. In addition, from the second electrode 80, a common wiring 92 which is the lead wiring is led out. Furthermore, a flexible cable 120 is connected to the end portions of the individual wiring 91 and the common wiring 92, which are extended on the side opposite to the end portion connected to the piezoelectric actuator 300. The flexible cable 120 is a wiring substrate having flexibility, and in the embodiment, a driving circuit 121 serving as a driving element is mounted.

In the embodiment, an insulating material is used as the first moisture barrier layer 200. As shown in FIGS. 2 and 4, the first moisture barrier layer 200 of the embodiment is provided continuously over the zirconium oxide layer 52 outside the piezoelectric layer 70 in the second direction Y. In addition, the first moisture barrier layer 200 extends from above the zirconium oxide layer 52 toward the active portion 310 in the second direction Y. The portion of the first moisture barrier layer 200 extending toward the active portion 310 covers the side surface of the piezoelectric layer 70 and extends to reach the surface on the Z1 side of the piezoelectric layer 70. The individual wiring 91 and the first electrode 60 are electrically connected via a contact hole 202 provided in the first moisture barrier layer 200.

In this manner, the first moisture barrier layer 200 is provided so as to cover the zirconium oxide layer 52 exposed on both sides of the piezoelectric actuator 300 in the second direction Y. Accordingly, it is possible to protect the zirconium oxide layer 52 on both sides of the piezoelectric actuator 300 in the second direction Y from moisture. Therefore, it is possible to inhibit the reaction between the zirconium oxide layer 52 and moisture, which causes breakage of the vibration plate 50, in the second direction Y and to inhibit the breakage of the vibration plate 50 under a high humidity environment or the like.

In addition, at the end of the piezoelectric actuator 300 on the side of the individual wiring 91 side in the second direction Y, the first moisture barrier layer 200 is provided between the individual wiring 91 and the first electrode 60. Accordingly, it is possible to inhibit the moisture from penetrating the zirconium oxide layer 52 through the interface between the individual wiring 91 and the first electrode 60 and to protect the zirconium oxide layer 52 from moisture.

Furthermore, the side surface of the piezoelectric layer 70 is covered with the first moisture barrier layer 200 in the second direction Y. Accordingly, it is possible to reduce the portion where the piezoelectric layer 70 is exposed to the outside and to protect the piezoelectric layer 70 from moisture. Therefore, deterioration of the piezoelectric layer 70 due to moisture and separation of the second electrode 80 from the piezoelectric layer 70 due to moisture can be inhibited.

The first moisture barrier layer 200 is not provided in a portion of the region overlapping the active portion 310 in the third direction Z, also in the second direction Y. That is, the first moisture barrier layer 200 extends to the active portion 310 on the one end side of the individual wiring 91 side in the second direction Y, and is provided outside the active portion 310, that is, outside the first electrode 60 on the other end side in the second direction Y. The first moisture barrier layer 200 is provided with the opening portion 201 opening to a main portion of the active portion 310. By providing the opening portion 201 in the first moisture barrier layer 200 in this manner, it is possible to inhibit the first moisture barrier layer 200 from inhibiting the deformation of the piezoelectric actuator 300 and to inhibit the decrease in the displacement amount of the piezoelectric actuator 300.

A protective substrate 30 having substantially the same size as the flow path forming substrate 10 is bonded to the surface of such a flow path forming substrate 10 on the Z1 side. The protective substrate 30 has a holding portion serving as a space for protecting the piezoelectric actuator 300. Two holding portions 31 are formed in parallel in the second direction Y between rows of piezoelectric actuators 300 disposed in parallel in the first direction X. In addition, the protective substrate 30 is provided with a through-hole 32 penetrating in the third direction Z between the two holding portions 31 disposed in parallel in the second direction Y. End portions of the individual wiring 91 and the common wiring 92 led out from the electrode of the piezoelectric actuator 300 are extended so as to be exposed in the through-hole 32, and the individual wiring 91 and the common wiring 92 are electrically connected to the flexible cable 120 in the through-hole 32. A method of connecting the individual wiring 91 and the common wiring 92 to the flexible cable 120 is not particularly limited, and examples thereof include brazing such as soldering, eutectic bonding, welding, a conductive adhesive (ACP, ACF) containing conductive particles, a nonconductive adhesive (NCP, NCF) and the like.

In addition, as shown in FIG. 3, the case member 40 that defines the manifold 100 communicating with the plurality of the pressure generating chambers 12 and the flow path forming substrate 10 is fixed to the protective substrate 30. The case member 40 has substantially the same shape as the above-described communicating plate 15 in plan view, and is bonded to the protective substrate 30 and to the above-described communicating plate 15.

Such a case member 40 has a recessed portion 41 of a depth at which the flow path forming substrate 10 and the protective substrate 30 are accommodated on the protective substrate 30 side. The recessed portion 41 has an opening area larger than the surface of the protective substrate 30 bonded to the flow path forming substrate 10. The opening surface of the recessed portion 41 on the nozzle plate 20 side is sealed by the communicating plate 15 in a state where the flow path forming substrate 10 and the like are accommodated in the recessed portion 41. As a result, a third manifold portion 42 is defined by the case member 40 and the flow path forming substrate 10 on the outer peripheral portion of the flow path forming substrate 10. The manifold 100 of the embodiment is configured to include the first manifold portion 17 and the second manifold portion 18 provided in the communicating plate 15, and the third manifold portion 42 defined by the case member 40 and the flow path forming substrate 10. The manifold 100 is continuously provided in the first direction X serving as the parallel arrangement direction of the pressure generating chambers 12, and the supply communicating paths 19 communicating each of the pressure generating chambers 12 and the manifold 100 are disposed in parallel in the first direction X.

In addition, a compliance substrate 45 is provided on the Z2 side surface of the communicating plate 15 on which the first manifold portion 17 and the second manifold portion 18 are opened. The compliance substrate 45 seals the openings of the first manifold portion 17 and the second manifold portion 18 on the liquid ejecting surface 20a side. In this embodiment, such a compliance substrate 45 includes a sealing film 46 made of a flexible thin film and a fixed substrate 47 made of a hard material such as a metal. Since the region of the fixed substrate 47 facing the manifold 100 is an opening portion 48 for fixed substrate completely removed in the thickness direction, one surface of the manifold 100 is a compliance portion 49 serving as a flexible portion sealed only with the flexible sealing film 46.

The case member 40 is provided with an introduction path 44 for communicating with the manifold 100 and supplying ink to each manifold 100. In addition, the case member 40 is provided with a connection port 43 that communicates with the through-hole 32 of the protective substrate 30 and through which the flexible cable 120 is inserted.

In such a recording head 1, when ink is ejected, the ink is taken from the introduction path 44, and the inside of the flow path is filled with the ink from the manifold 100 to the nozzle 21. Thereafter, according to a signal from the driving circuit 121, a voltage is applied to each of the active portions 310 corresponding to the pressure generating chambers 12, so that the vibration plate 50 and the active portion 310 are bent and deformed. As a result, the pressure in the pressure generating chamber 12 increases, and ink droplets are ejected from the predetermined nozzle 21.

As described above, in the embodiment, the device includes a flow path forming substrate 10 serving as the substrate on which the pressure generating chamber 12 serving as the plurality of the first recessed portions is formed, the vibration plate 50 that is provided on one surface side of the flow path forming substrate 10 and has the zirconium oxide layer 52 containing the zirconium oxide as the uppermost layer on the side opposite to the flow path forming substrate 10, and the piezoelectric element 300 that has the first electrode 60 provided on one surface side of the flow path forming substrate 10 via the vibration plate 50, the piezoelectric layer 70 provided on the first electrode 60, and the second electrode 80 provided on the piezoelectric layer 70, in which in the piezoelectric element 300, the active portion 310 of the piezoelectric layer 70 interposed between the first electrode 60 and the second electrode 80 is provided independently for each of the pressure generating chambers 12, the first electrode 60 forms an individual electrode provided independently for each of the active portions 310, the second electrode 80 forms a common electrode commonly provided to a plurality of the active portions 310, in the piezoelectric layer 70, the second recessed portion 71 which is provided outside the active portion 310 and opens on the side opposite to the flow path forming substrate 10 is provided, in the third direction Z serving as a lamination direction of the flow path forming substrate 10 and the piezoelectric element 300, the first moisture barrier layer 200 formed of a material other than the zirconium oxide is formed in a region of the vibration plate 50 opposite to the flow path forming substrate 10 and overlapping the bottom surface of the second recessed portion 71, and the first moisture barrier layer 200 is not formed in a portion of a region overlapping the active portion 310 in the third direction Z.

In this manner, the displacement characteristic of the piezoelectric element 300 can be improved by providing the second recessed portion 71. Even if the zirconium oxide layer of the vibration plate 50 approaches the external atmosphere by providing the second recessed portion 71, it is possible to inhibit the zirconium oxide layer 52 from reacting with moisture and to protect the vibration plate 50 from moisture by providing the first moisture barrier layer 200. Therefore, the zirconium oxide layer 52 reacts with moisture to change the characteristics of the vibration plate 50, so that the vibration plate 50 can be inhibited from being broken.

In addition, by providing the first moisture barrier layer 200, the vibration plate 50 can be protected from moisture permeated through the second electrode 80. Accordingly, the thickness of the second electrode 80 can be made relatively thin and the active portion 310 can be disposed with high density.

In addition, in the embodiment, it is preferable that the plurality of the active portions 310 be disposed in parallel in the first direction X, and the second recessed portions 71 be provided on both sides of the active portion 310 in the first direction X. According to this, the active portion 310 can be disposed in high density in the first direction X and the displacement amount of the active portion 310 in the third direction Z in the cross section in the first direction X can be improved.

In addition, it is preferable that in the third direction Z serving as the lamination direction, the second recessed portion 71 and the pressure generating chamber 12 serving as the first recessed portion be disposed on at least a position partially overlapping each other. According to this, the rigidity of the arm portion between the wall surface of the flow path forming substrate 10 and the active portion 310 can be reduced by the second recessed portion 71 to improve the displacement characteristic of the active portion 310.

It goes without saying that in the third direction Z, the pressure generating chamber 12 serving as the first recessed portion and the second recessed portion 71 may not be disposed on at least the position partially overlapping each other.

In addition, it is preferable that the first moisture barrier layer 200 provided in the region overlapping the bottom surface 711 of the second recessed portion 71 in the third direction Z serving as the lamination direction be provided between the vibration plate 50 and the second electrode 80. According to this, moisture is inhibited from penetrating from the interface between the first moisture barrier layer 200 and the second electrode 80, and the vibration plate 50 can be inhibited from reacting with moisture to break the vibration plate 50.

In addition, it is preferable that the first moisture barrier layer 200 extend from the region overlapping the bottom surface 711 of the second recessed portion 71 toward the active portion 310 side in the third direction Z serving as the lamination direction. According to this, by extending the first moisture barrier layer 200, the vibration plate 50 on the active portion 310 side from the bottom surface of the second recessed portion 71 can be protected from moisture.

In addition, it is preferable that a portion of the first moisture barrier layer 200 extending toward the active portion 310 side be provided between the piezoelectric layer 70 and the second electrode 80. According to this, even if moisture permeates through the second electrode 80, the piezoelectric layer 70 and the vibration plate 50 below the second electrode 80 can be protected by the first moisture barrier layer 200, and a separation of an interface between the piezoelectric layer 70 and the second electrode 80 can be inhibited.

In addition, it is preferable that the first moisture barrier layer 200 be formed of the metal. As described above, when the first moisture barrier layer 200 is formed of the metal, and according to this, when the piezoelectric layer 70 is fired, since the first moisture barrier layer 200 can be simultaneously annealed by heat treatment, formation of pinholes or the like in the first moisture barrier layer 200 can be inhibited, and the moisture barrier property can be improved.

In addition, it is preferable that the first moisture barrier layer 200 have an amorphous oxide film or a nitride film. As described above, when the first moisture barrier layer 200 is formed of the amorphous oxide film or the nitride film, permeation of moisture can be reliably inhibited, mechanical strength can be improved, and generation of cracks and the like in the vibration plate 50 and the first moisture barrier layer 200 can be inhibited.

In addition, it is preferable that the second recessed portion 71 be provided so as to penetrate the piezoelectric layer 70 in the third direction Z serving as the lamination direction, and at the bottom surface 711 of the second recessed portion 71, the vibration plate 50, the first moisture barrier layer 200, and the second electrode 80 be laminated in this order from the flow path forming substrate 10 side serving as the substrate. According to this, when the second recessed portion 71 penetrates the piezoelectric layer 70 in the third direction Z, the rigidity of the arm portion is decreased and the displacement characteristic of the active portion 310 can be improved. Even if the second electrode 80 is provided on the vibration plate 50, the vibration plate 50 can be protected from moisture permeated through the second electrode 80 by providing the first moisture barrier layer 200.

It goes without saying that the second recessed portion 71 may be provided without penetrating the piezoelectric layer 70 in the third direction Z.

Embodiment 2

Figure 6:
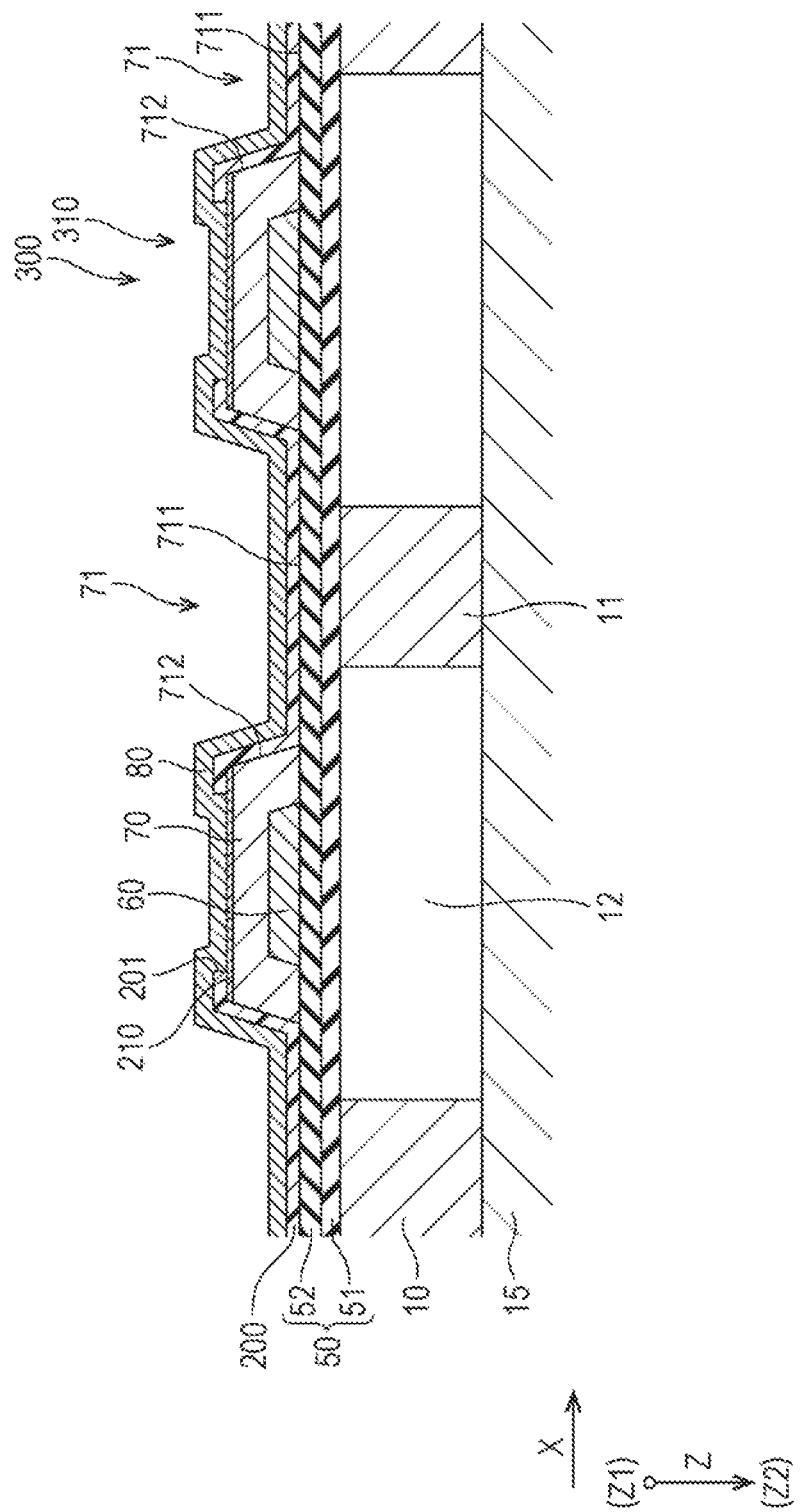
FIG. 6 is an enlarged cross-sectional view of a main part of a recording head according to Embodiment 2 of the invention.

FIG. 6 is a cross-sectional view of a main part of an ink jet type recording head as an example of a liquid ejecting head according to Embodiment 2 of the invention, which is a cross-sectional view taken along line VI-VI in FIG. 2. The same reference numerals are given to members similar to those in the above-described embodiment, and redundant explanations are omitted.

As shown in FIG. 6, in the piezoelectric element 300 of the embodiment, the first moisture barrier layer 200 and a second moisture barrier layer 210 are provided.

The second moisture barrier layer 210 is formed of a material different from that of the first moisture barrier layer 200 between the piezoelectric layer 70 and the second electrode 80 of the active portion 310.

As the material of the first moisture barrier layer 200, the same material as the above first moisture barrier layer 200 can be used.

In addition, as the material of the second moisture barrier layer 210, a metal is used. The metal serving as the material of the second moisture barrier layer 210 may be a material having conductivity and includes a metal and a metal oxide. In addition, as the metal used for the second moisture barrier layer 210, for example, it is preferable to use at least one noble metal selected from gold (Au), silver (Ag), platinum (Pt), Palladium (Pd), rhodium (Rh), iridium (Ir), ruthenium (Ru), osmium (Os). In addition, in a case where the metal is used as the second moisture barrier layer 210, by performing an annealing treatment after the film formation, formation of pinholes and the like can be inhibited to improve the moisture barrier property.

By using the second moisture barrier layer 210 as a conductive material, it is possible to apply a voltage to the active portion 310 of the piezoelectric layer 70 from the second electrode 80 via the second moisture barrier layer 210. In addition, the first moisture barrier layer 200 and the second moisture barrier layer 210 are formed of different materials. Accordingly, as the first moisture barrier layer 200, a material having a low moisture permeability can be used without applying a voltage to the active portion 310, and the vibration plate 50 can be protected from moisture. As the second moisture barrier layer 210, a voltage can be applied to the active portion 310 and a material suitable for deformation of the active portion 310 can be used.

In addition, by providing the second moisture barrier layer 210, the piezoelectric layer 70 can be protected from the moisture permeated through the second electrode 80 in the active portion 310. Therefore, deterioration of the piezoelectric layer 70 due to moisture and separation of the second electrode 80 from the piezoelectric layer 70 due to moisture can be inhibited. That is, the second electrode 80 and the second moisture barrier layer 210 are formed of the metals, so that these can be firmly bonded to each other, and separation is unlikely to occur between the second electrode 80 and the second moisture barrier layer 210 due to moisture permeated through the second electrode 80. In addition, since moisture permeating through the second electrode 80 is unlikely to penetrate into the piezoelectric layer 70 side by the second moisture barrier layer 210, separation due to moisture between the second moisture barrier layer 210 and the piezoelectric layer 70 is unlikely to occur.

In addition, Further, in the third direction Z serving as the lamination direction of the flow path forming substrate 10 and the piezoelectric element 300, the first moisture barrier layer 200 and the second moisture barrier layer 210 are disposed on at least positions partially overlapping each other. That is, in the embodiment, the second moisture barrier layer 210 extends from the active portion 310 to the outside of the active portion 310, in this extended portion, the first moisture barrier layer 200 and the second moisture barrier layer 210 are disposed to overlap each other in the third direction Z.

In this manner, the first moisture barrier layer 200 and the second moisture barrier layer 210 are disposed so as to at least partially overlap each other in the third direction Z. Accordingly, moisture permeated through the second electrode 80 can be reliably inhibited from penetrating to the vibration plate 50 side, and problems due to moisture in the vibration plate 50 can be inhibited.

As described above, in the embodiment, the second moisture barrier layer 210 formed of the material different from that of the first moisture barrier layer 200 is provided between the piezoelectric layer 70 of the active portion 310 and the second electrode 80. By providing the second moisture barrier layer 210 in the active portion 310 in this manner, the piezoelectric layer 70 can be protected from moisture permeated through the second electrode 80 in the active portion 310. Therefore, deterioration of the piezoelectric layer 70 due to moisture and separation of the second electrode from the piezoelectric layer 70 due to moisture can be inhibited.

In addition, the first moisture barrier layer 200 and the second moisture barrier layer 210 are formed of different materials. Accordingly, as the first moisture barrier layer 200, a material having a low moisture permeability can be used without applying a voltage to the active portion 310, and the vibration plate 50 can be protected from moisture. As the second moisture barrier layer 210, a voltage can be applied to the active portion 310 and a material suitable for deformation of the active portion 310 can be used.

In addition, in the third direction Z serving as the lamination direction, it is preferable that the first moisture barrier layer 200 and the second moisture barrier layer 210 be disposed on at least the position partially overlapping each other. According to this, in the third direction Z, since the portion where the vibration plate 50 overlaps from the second recessed portion 71 to the active portion 310 is covered with the first moisture barrier layer 200 and the second moisture barrier layer 210, the vibration plate 50 in this portion can be reliably protected from moisture.

It goes without saying that the first moisture barrier layer 200 and the second moisture barrier layer 210 may be disposed on at least the position not partially overlapping each other in the third direction Z.

In addition, the second moisture barrier layer 210 is preferably the metal. According to this, a voltage can be applied from the second electrode 80 to the active portion 310 of the piezoelectric layer 70.

Embodiment 3

Figure 7:
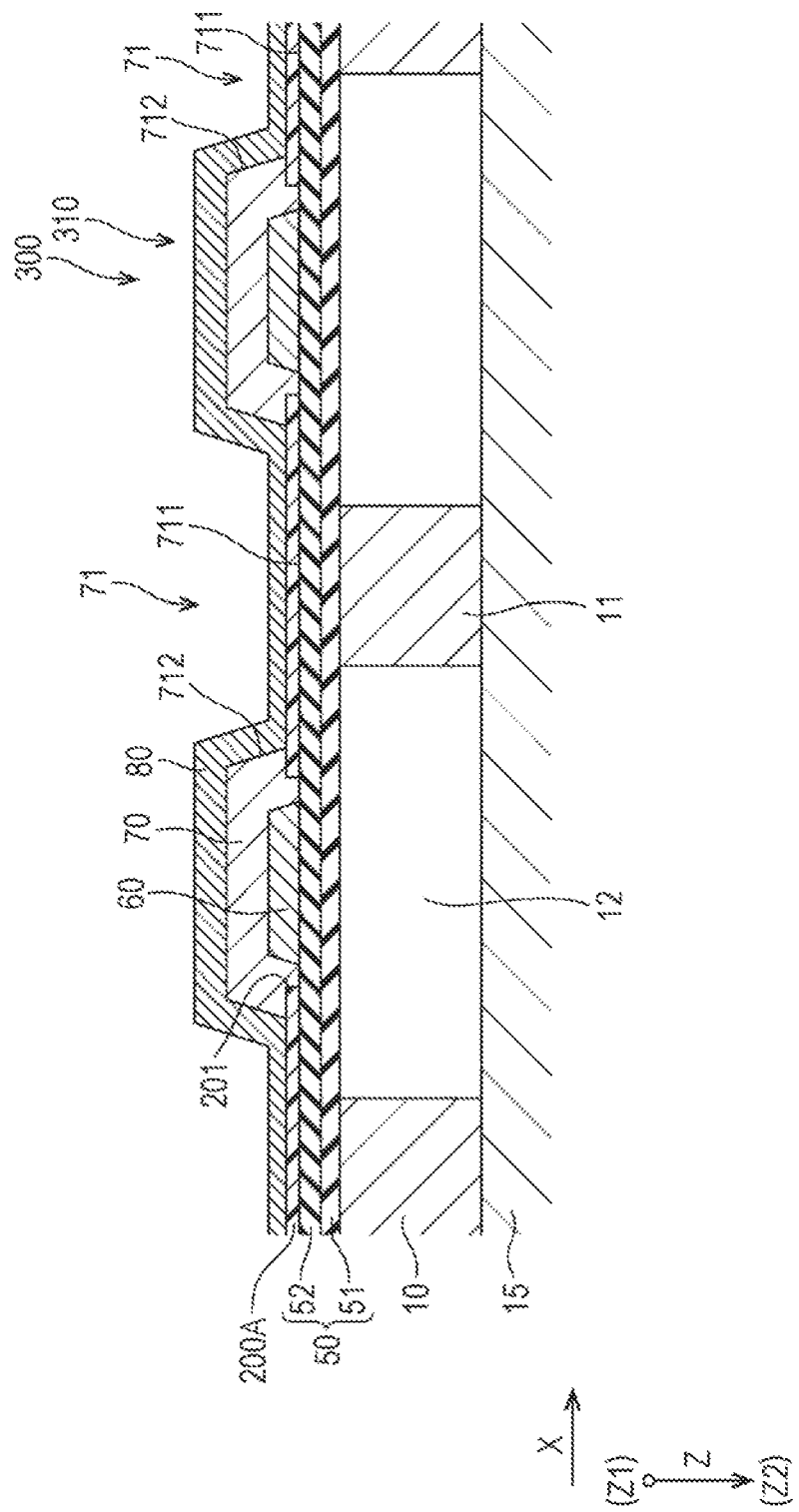
FIG. 7 is an enlarged cross-sectional view of a main part of a recording head according to Embodiment 3 of the invention.
Figure 8:
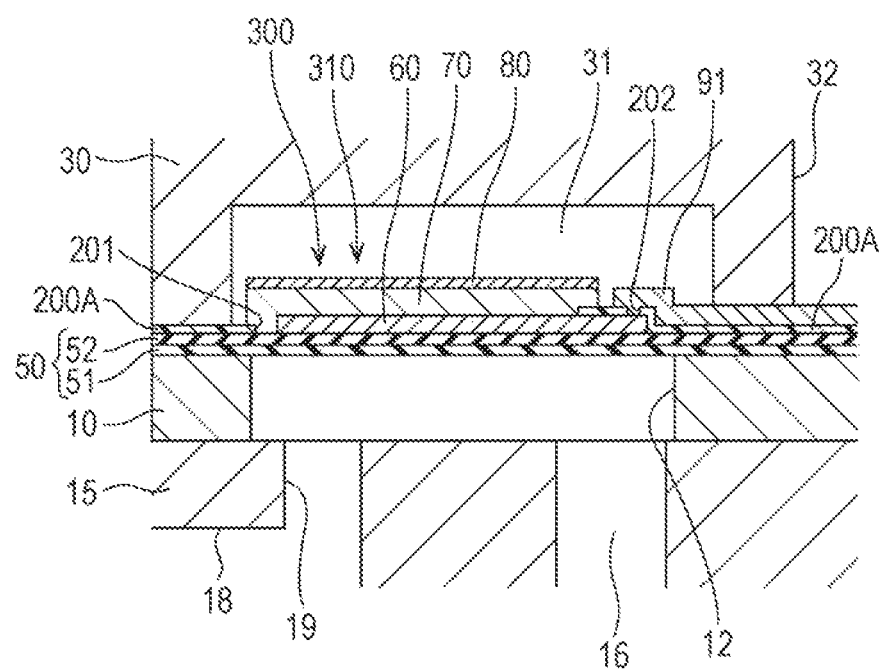
FIG. 8 is an enlarged cross-sectional view of a main part of a recording head according to Embodiment 3 of the invention.
Figure 8:
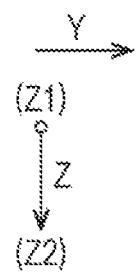

FIG. 7 is a cross-sectional view of a main part of an ink jet type recording head as an example of a liquid ejecting head according to Embodiment 3 of the invention, which is a cross-sectional view taken along line VII-VII in FIG. 2. FIG. 8 is a cross-sectional view of a main part of an ink jet type recording head according to Embodiment 3, which is a cross-sectional view taken along line VIII-VIII in FIG. 2. The same reference numerals are given to members similar to those in the above-described embodiment, and redundant explanations are omitted.

As shown in FIG. 7, in the third direction Z, in a region of the vibration plate 50 on the side opposite to the flow path forming substrate 10 and overlapping at least the bottom surface 711 of the second recessed portion 71 of the piezoelectric layer 70, a first moisture barrier layer 200A formed of a material different from that of the second electrode 80 is provided. In the embodiment, the second recessed portion 71 is provided so as to penetrate the piezoelectric layer 70 in the third direction Z serving as the lamination direction, and the first moisture barrier layer 200A is provided between the vibration plate 50 and the second electrode 80 in a region overlapping the bottom surface 711 of the second recessed portion 71. That is, since the second recessed portion 71 penetrates the piezoelectric layer 70 in the third direction Z, the vibration plate 50, the first moisture barrier layer 200, and the second electrode 80 are laminated in this order on the bottom surface 711 of the second recessed portion 71 from the flow path forming substrate 10 side.

In addition, the first moisture barrier layer 200A extends from the region overlapping the bottom surface 711 of the second recessed portion 71 toward the active portion 310 side. A portion of the first moisture barrier layer 200 extending from the bottom surface 711 of the second recessed portion 71 toward the active portion 310 is provided between the vibration plate 50 and the piezoelectric layer 70 in the embodiment. That is, the first moisture barrier layer 200A is provided on the surface of the vibration plate 50 opposite to the flow path forming substrate 10.

The first moisture barrier layer 200A as described above is not provided in a portion of the region overlapping the active portion 310 in the third direction Z. In the embodiment, the first moisture barrier layer 200 is not provided until reaching the first electrode 60, and is not provided in all of the regions overlapping the active portion 310. That is, the opening portion 201 of the first moisture barrier layer 200A is provided with a wider width than that of the first electrode 60 in the first direction X.

By providing the first moisture barrier layer 200A on the vibration plate 50 in this manner, when the first moisture barrier layer 200A is formed and patterned, the first moisture barrier layer 200 can be patterned on a plane on the vibration plate 50. Accordingly, it is possible to improve the patterning accuracy and to inhibit variations in displacement characteristics of the piezoelectric element 300 due to positional deviation of the opening portion 201.

As such a first moisture barrier layer 200A, a material that can withstand the firing of the piezoelectric layer 70 is required, and it is preferable to use a metal, particularly a noble metal. By using the metal as the first moisture barrier layer 200A, it is possible to simultaneously anneal the first moisture barrier layer 200A when the piezoelectric layer 70 is fired. Accordingly, the step of annealing the first moisture barrier layer 200A is unnecessary and the cost can be reduced. In addition, by annealing the first moisture barrier layer 200A, formation of pin holes and the like in the first moisture barrier layer 200A can be inhibited, and the moisture barrier property can be improved.

In addition, the first moisture barrier layer 200A is provided on the zirconium oxide layer 52 outside the piezoelectric actuator 300 in the second direction Y. For example, in a case where the insulating material is used as the first moisture barrier layer 200A, as shown in FIG. 8, the first moisture barrier layer 200A can be provided continuously between the individual wiring 91 and the zirconium oxide layer 52 and between the individual wirings 91 disposed in parallel in the first direction X. In a case where the first moisture barrier layer 200A is made of a conductive material, in order not to short-circuit the plurality of the individual wirings 91, it is necessary to selectively provide the first moisture barrier layer 200A between the individual wiring 91 and the zirconium oxide layer 52 so as to have the same structure as that of FIG. 8, or, although not shown in particular, to selectively provide the first moisture barrier layer 200A between the individual wirings 91 adjacent to each other in the first direction X.

In addition, the first moisture barrier layer 200A of the embodiment extends from the zirconium oxide layer 52 toward the active portion 310 in the second direction Y. The portion of the first moisture barrier layer 200A extending toward the active portion 310 extends between the piezoelectric layer 70 and the zirconium oxide layer 52, that is, between the piezoelectric layer 70 and the zirconium oxide layer 52 or the first electrode 60.

The first moisture barrier layer 200A is not provided in a portion of the region overlapping the active portion 310 in the third direction Z, also in the second direction Y. That is, the first moisture barrier layer 200A extends to the active portion 310 on the other end side in the second direction Y, and is provided outside the active portion 310, that is, outside the first electrode 60 on the one end side in the second direction Y. The first moisture barrier layer 200A is provided with the opening portion 201 opening to the main portion of the active portion 310. By providing the opening portion 201 in the first moisture barrier layer 200A in this manner, it is possible to inhibit the first moisture barrier layer 200A from inhibiting the deformation of the piezoelectric actuator 300 and to inhibit the decrease in the displacement amount of the piezoelectric actuator 300.

As described above, in the embodiment, a portion of the first moisture barrier layer 200A extending toward the active portion 310 side is provided between the vibration plate 50 and the piezoelectric layer 70.

In this manner, the displacement characteristic of the piezoelectric element 300 can be improved by providing the second recessed portion 71 in the piezoelectric layer 70. Even if the vibration plate 50 approaches the external atmosphere by providing the second recessed portion 71, it is possible to protect the vibration plate 50 from moisture by providing the first moisture barrier layer 200A. Therefore, the zirconium oxide contained in the vibration plate 50 reacts with moisture to change the characteristics of the vibration plate 50, so that the vibration plate 50 can be inhibited from being broken.

In addition, the portion of the first moisture barrier layer 200A extending toward the active portion 310 is provided between the vibration plate 50 and the piezoelectric layer 70. Accordingly, a region close to the external atmosphere of the zirconium oxide layer 52 can be protected by covering the region with the first moisture barrier layer 200A and the reaction with the moisture of the zirconium oxide layer 52 can be reliably inhibited. That is, even if the piezoelectric layer 70 is interposed between the second recessed portion 71 and the zirconium oxide layer 52, when the thickness of the interposing piezoelectric layer 70 is small, there is a possibility that moisture permeated through the second electrode 80 reaches the zirconium oxide layer 52. In the embodiment, the first moisture barrier layer 200A is extended to the active portion 310 side and the extended portion is provided between the vibration plate 50 and the piezoelectric layer 70. Accordingly, it is possible to inhibit the moisture permeated through the relatively thin piezoelectric layer 70 from reaching the zirconium oxide layer 52.

In addition, it is provided so as to cover the zirconium oxide layer 52 exposed on both sides of the piezoelectric actuator 300 in the second direction Y. Accordingly, it is possible to protect the zirconium oxide layer 52 on both sides of the piezoelectric actuator 300 in the second direction Y from moisture. Therefore, it is possible to inhibit the reaction between the zirconium oxide layer 52 and moisture, which causes breakage of the vibration plate 50, in the second direction Y and to inhibit the breakage of the vibration plate 50 under a high humidity environment or the like.

In addition, at the end of the piezoelectric actuator 300 on the side of the individual wiring 91 side in the second direction Y, the first moisture barrier layer 200A is provided between the individual wiring 91 and the first electrode 60. Accordingly, it is possible to inhibit the moisture from penetrating the zirconium oxide layer 52 through the interface between the individual wiring 91 and the first electrode 60 and to protect the zirconium oxide layer 52 from moisture.

Embodiment 4

Figure 9:
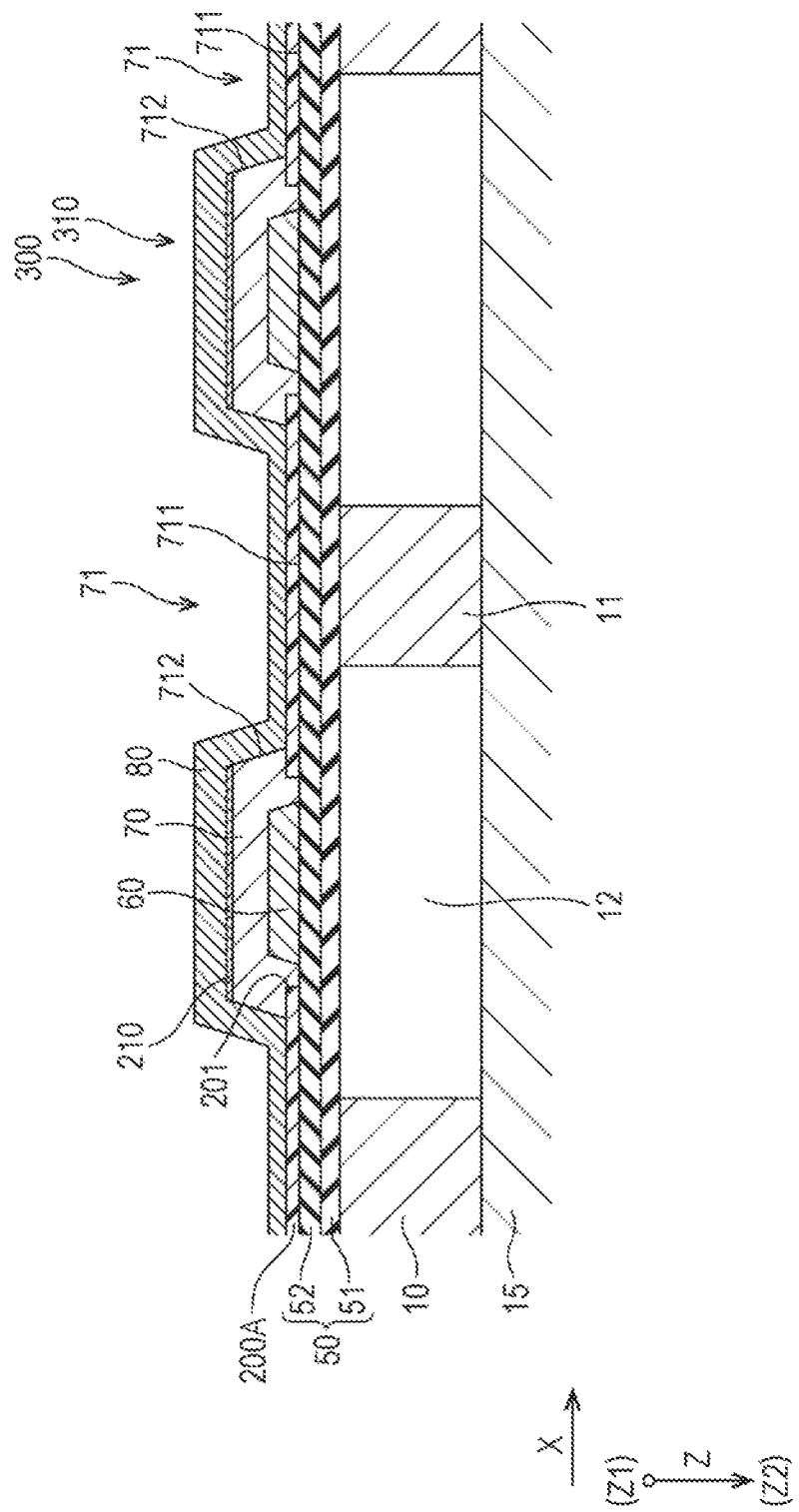
FIG. 9 is an enlarged cross-sectional view of a main part of a recording head according to Embodiment 4 of the invention.

FIG. 9 is a cross-sectional view of a main part of an ink jet type recording head as an example of a liquid ejecting head according to Embodiment 4 of the invention, which is a cross-sectional view taken along line IX-IX in FIG. 2. The same reference numerals are given to members similar to those in the above-described embodiment, and redundant explanations are omitted.

As shown in FIG. 9, in the piezoelectric element 300 of the embodiment, the first moisture barrier layer 200A and the second moisture barrier layer 210 are provided.

The first moisture barrier layer 200A is a member similar to Embodiment 3 described above. That is, in the region overlapping the bottom surface 711 of the second recessed portion 71 in the third direction Z, the first moisture barrier layer 200A is provided between the vibration plate 50 and the second electrode 80. That is, since the second recessed portion 71 is provided so as to penetrate the piezoelectric layer 70 in the third direction Z, the vibration plate 50, the first moisture barrier layer 200, and the second electrode 80 are laminated in this order on the bottom surface 711 of the second recessed portion 71 from the flow path forming substrate 10 side. As the first moisture barrier layer 200A, the same material as that of Embodiment 3 described above can be used.

The second moisture barrier layer 210 is a member similar to Embodiment 2 described above, and is formed of a material different from that of the first moisture barrier layer 200 between the piezoelectric layer 70 of the active portion 310 and the second electrode 80. As the second moisture barrier layer 210, the same material as that of Embodiment 2 described above can be used.

In the third direction Z serving as the lamination direction of the flow path forming substrate 10 and the piezoelectric element 300, the first moisture barrier layer 200 and the second moisture barrier layer 210 are disposed on at least the position partially overlapping each other. That is, in the embodiment, the second moisture barrier layer 210 extends from the active portion 310 to the outside of the active portion 310. In the extended portion, the first moisture barrier layer 200 and the second moisture barrier layer 210 are disposed to overlap each other in the third direction Z.

In this manner, the first moisture barrier layer 200 and the second moisture barrier layer 210 are disposed so as to at least partially overlap each other in the third direction Z. Accordingly, it is possible to reliably inhibit penetration of moisture permeated through the second electrode 80 to the vibration plate 50 side, and to inhibit the problems due to moisture in the vibration plate 50.

By using the second moisture barrier layer 210 as a conductive material, it is possible to apply a voltage to the active portion 310 of the piezoelectric layer 70 from the second electrode 80 via the second moisture barrier layer 210. In addition, the first moisture barrier layer 200 and the second moisture barrier layer 210 are formed of different materials. Accordingly, as the first moisture barrier layer 200, a material having a low moisture permeability can be used without applying a voltage to the active portion 310, and the vibration plate 50 can be protected from moisture. As the second moisture barrier layer 210, a voltage can be applied to the active portion 310 and a material suitable for deformation of the active portion 310 can be used.

In addition, by providing the second moisture barrier layer 210, the piezoelectric layer 70 can be protected from the moisture permeated through the second electrode 80 in the active portion 310. Therefore, deterioration of the piezoelectric layer 70 due to moisture and separation of the second electrode 80 from the piezoelectric layer 70 due to moisture can be inhibited. That is, the second electrode 80 and the second moisture barrier layer 210 are formed of the metals, so that these can be firmly bonded to each other, and separation is unlikely to occur between the second electrode 80 and the second moisture barrier layer 210 due to moisture permeated through the second electrode 80. In addition, since moisture permeating through the second electrode 80 is unlikely to penetrate into the piezoelectric layer 70 side by the second moisture barrier layer 210, separation due to moisture between the second moisture barrier layer 210 and the piezoelectric layer 70 is unlikely to occur.

In addition, Further, in the third direction Z serving as the lamination direction of the flow path forming substrate 10 and the piezoelectric element 300, the first moisture barrier layer 200 and the second moisture barrier layer 210 are disposed on at least positions partially overlapping each other. That is, in the embodiment, the second moisture barrier layer 210 extends from the active portion 310 to the outside of the active portion 310, in this extended portion, the first moisture barrier layer 200 and the second moisture barrier layer 210 are disposed to overlap each other in the third direction Z.

In this manner, the first moisture barrier layer 200 and the second moisture barrier layer 210 are disposed so as to at least partially overlap each other in the third direction Z. Accordingly, moisture permeated through the second electrode 80 can be reliably inhibited from penetrating to the vibration plate 50 side, and problems due to moisture in the vibration plate 50 can be inhibited.

As described above, in the embodiment, the second moisture barrier layer 210 formed of the material different from that of the first moisture barrier layer 200 is provided between the piezoelectric layer 70 of the active portion 310 and the second electrode 80. By providing the second moisture barrier layer 210 in the active portion 310 in this manner, the piezoelectric layer 70 can be protected from moisture permeated through the second electrode 80 in the active portion 310. Therefore, deterioration of the piezoelectric layer 70 due to moisture and separation of the second electrode from the piezoelectric layer 70 due to moisture can be inhibited.

In addition, the first moisture barrier layer 200 and the second moisture barrier layer 210 are formed of different materials. Accordingly, as the first moisture barrier layer 200, a material having a low moisture permeability can be used without applying a voltage to the active portion 310, and the vibration plate 50 can be protected from moisture. As the second moisture barrier layer 210, a voltage can be applied to the active portion 310 and a material suitable for deformation of the active portion 310 can be used.

In addition, in the third direction Z serving as the lamination direction, it is preferable that the first moisture barrier layer 200 and the second moisture barrier layer 210 be disposed on at least the position partially overlapping each other. According to this, in the third direction Z, since the portion where the vibration plate 50 overlaps from the second recessed portion 71 to the active portion 310 is covered with the first moisture barrier layer 200 and the second moisture barrier layer 210, the vibration plate 50 in this portion can be reliably protected from moisture.

It goes without saying that the first moisture barrier layer 200 and the second moisture barrier layer 210 may be disposed on at least the position not partially overlapping each other in the third direction Z.

In addition, the second moisture barrier layer 210 is preferably the metal. According to this, a voltage can be applied from the second electrode 80 to the active portion 310 of the piezoelectric layer 70.

Embodiment 5

Figure 10:
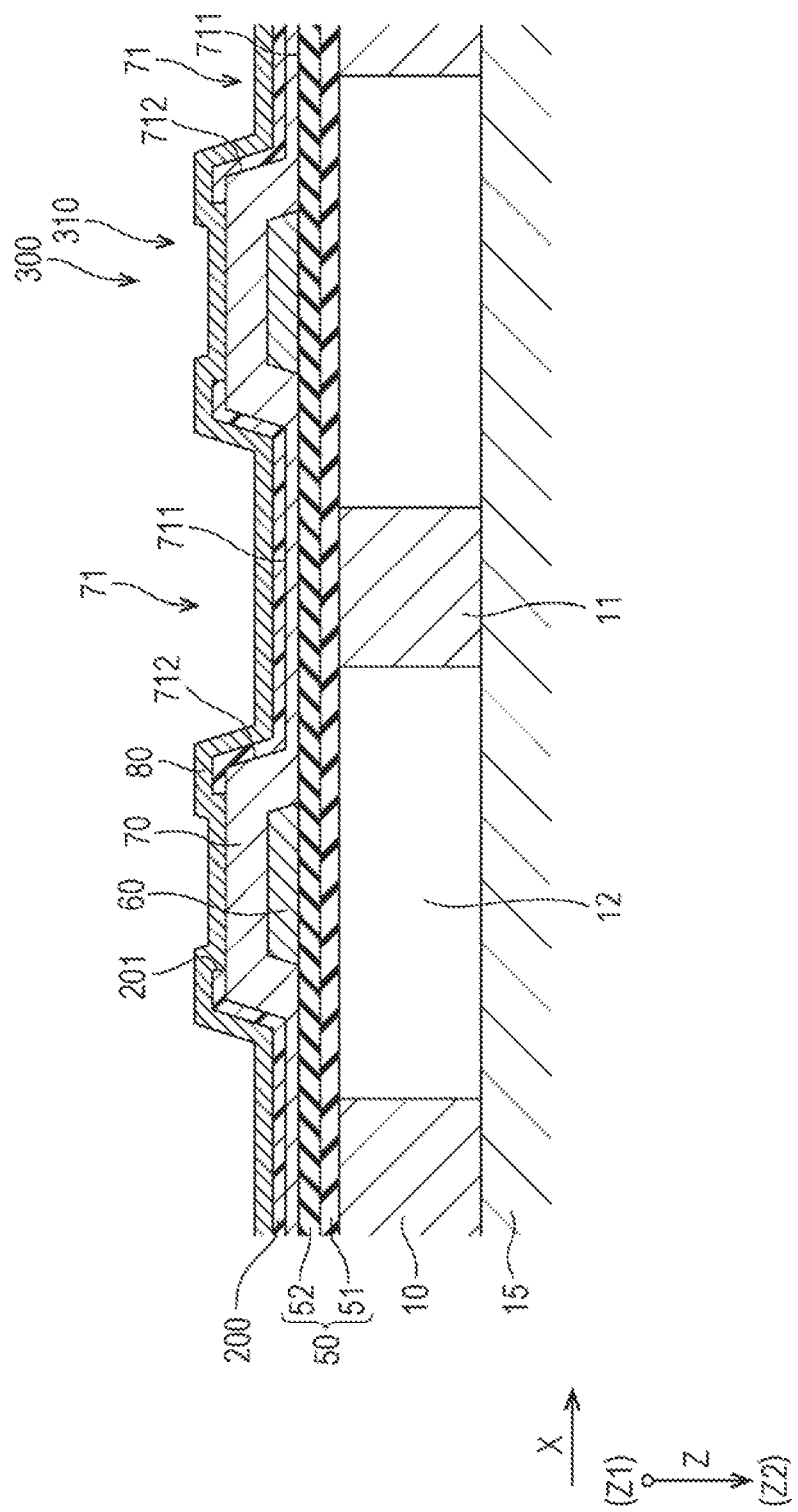
FIG. 10 is an enlarged cross-sectional view of a main part of a recording head according to Embodiment 5 of the invention.

FIG. 10 is a cross-sectional view of a main part of an ink jet type recording head as an example of a liquid ejecting head according to Embodiment 5 of the invention, which is a cross-sectional view taken along line X-X in FIG. 2. The same reference numerals are given to members similar to those in the above-described embodiment, and redundant explanations are omitted.

As shown in FIG. 10, in the embodiment, the second recessed portion 71 is formed in a state where the piezoelectric layer 70 is left on the bottom surface 711 side, without penetrating the piezoelectric layer 70 in the third direction Z serving as the lamination direction. The piezoelectric element 300 is provided with the first moisture barrier layer 200 similar to Embodiment 1 described above. That is, in the first moisture barrier layer 200, the vibration plate 50, the first moisture barrier layer 200, the piezoelectric layer 70, and the second electrode 80 are laminated in this order from the flow path forming substrate side on the bottom surface 711 of the second recessed portion 71.

Even with such a configuration, similarly to Embodiment 1 described above, the displacement characteristic of the piezoelectric element 300 can be improved by providing the second recessed portion 71. Even if the vibration plate 50 approaches the external atmosphere by providing the second recessed portion 71, it is possible to protect the vibration plate 50 from moisture by providing the first moisture barrier layer 200. Therefore, the zirconium oxide contained in the vibration plate 50 reacts with moisture to change the characteristics of the vibration plate 50, so that the vibration plate 50 can be inhibited from being broken.

In the embodiment, a configuration in which the first moisture barrier layer 200 similar to Embodiment 1 described above is provided is exemplified, and the invention is not particularly limited thereto. The piezoelectric layer 70 of the embodiment may be applied to Embodiments 2 to 4 described above and Embodiment 6 described later.

Embodiment 6

Figure 11:
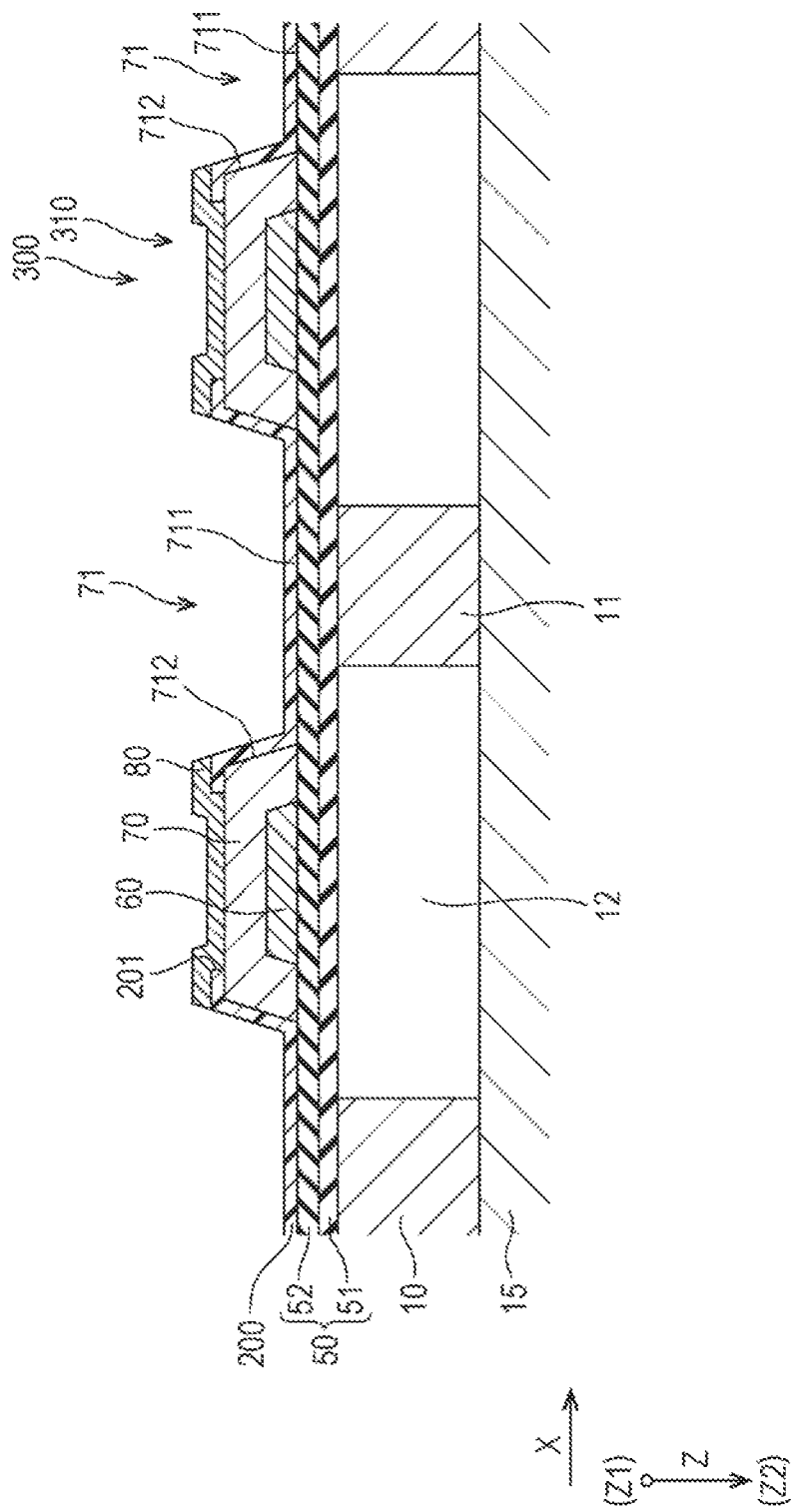
FIG. 11 is an enlarged cross-sectional view of a main part of a recording head according to Embodiment 6 of the invention.

FIG. 11 is a cross-sectional view of a main part of an ink jet type recording head as an example of a liquid ejecting head according to Embodiment 6 of the invention, which is a cross-sectional view taken along line XI-XI in FIG. 2. The same reference numerals are given to members similar to those in the above-described embodiment, and redundant explanations are omitted.

As shown in FIG. 11, the second electrode 80 of the embodiment is not formed on the inner surface of the second recessed portion 71, that is, on the bottom surface 711 and the side surface 712. The piezoelectric element 300 is provided with the first moisture barrier layer 200 similar to Embodiment 1 described above. That is, in the first moisture barrier layer 200, the vibration plate 50 and the first moisture barrier layer 200 are laminated in this order from the flow path forming substrate 10 side at the bottom surface 711 of the second recessed portion 71.

Even with such a configuration, similarly to Embodiment 1 described above, the displacement characteristic of the piezoelectric element 300 can be improved by providing the second recessed portion 71. Even if the vibration plate 50 approaches the external atmosphere by providing the second recessed portion 71, it is possible to protect the vibration plate 50 from moisture by providing the first moisture barrier layer 200. Therefore, the zirconium oxide contained in the vibration plate 50 reacts with moisture to change the characteristics of the vibration plate 50, so that the vibration plate 50 can be inhibited from being broken. That is, even with the vibration plate 50 exposed to the outside by the second recessed portion 71, the vibration plate 50 can be protected from a moisture portion by providing the first moisture barrier layer 200 on a region exposed at least to the outside of the vibration plate 50.

In the embodiment, a configuration in which the first moisture barrier layer 200 similar to Embodiment 1 described above is provided is exemplified, and the invention is not particularly limited thereto. The piezoelectric layer 70 of the embodiment may be applied to Embodiments 2 to 5 described above.

Other Embodiment

Hereinbefore, although the embodiments of the invention are described, the basic configuration of the invention is not limited to the above-described embodiments.

For example, in each of the embodiments described above, an example in which the communicating plate 15 and the nozzle plate 20 are provided on the Z2 side of the flow path forming substrate 10 is exemplified, and the invention is not particularly limited thereto. For example, the nozzle plate 20 may be bonded directly to the surface on the Z2 side of the flow path forming substrate 10 without providing the communicating plate 15.

In addition, in each of the embodiments described above, a single crystal silicon substrate is used as the flow path forming substrate 10, and the invention is not limited thereto. As the flow path forming substrate 10, materials such as an SOI substrate and glass may be used.

In addition, in Embodiments 1, 2, 5, and 6 described above, the first moisture barrier layer 200 has a configuration in which the end portion is located outside the active portion 310 on the Z1 side surface of the piezoelectric layer 70 in the cross section in the first direction X, and it is not particularly limited thereto. The first moisture barrier layer 200 may be provided inside the active portion 310 on the Z1 side surface of the piezoelectric layer 70, that is, the region overlapping the active portion 310 in the third direction Z, in the cross section in the first direction X. That is, the first moisture barrier layer 200 may have the opening portion 201 smaller than the active portion 310. It goes without saying that, even in Embodiments 3 and 4, in the case where the insulating material is used as the first moisture barrier layer 200A, the opening portion 201 of the first moisture barrier layer 200A may be provided so as to be narrower than the width of the first electrode 60 in the first direction X.

Figure 12:
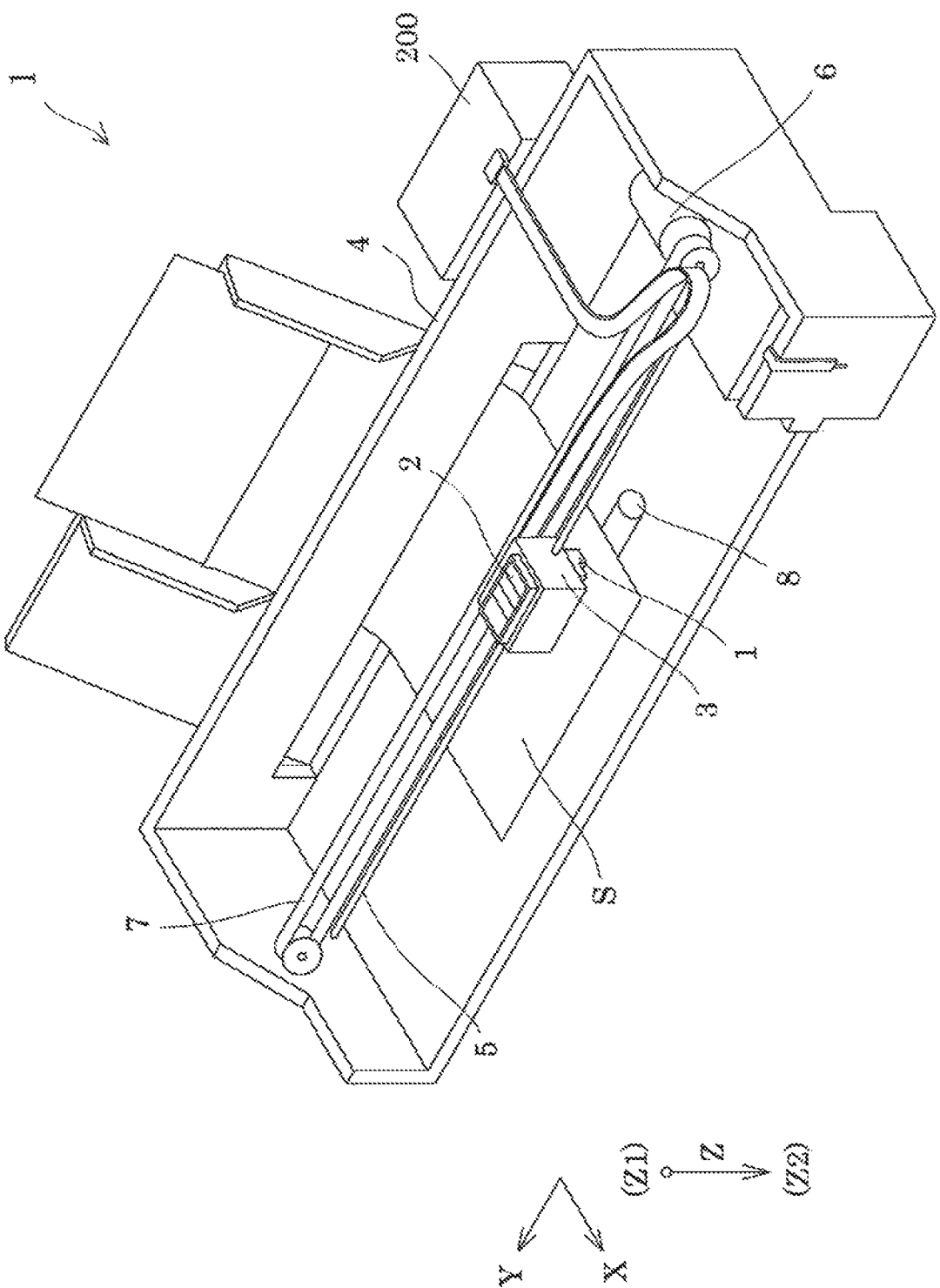
FIG. 12 is a schematic diagram of a recording apparatus according to an embodiment of the invention.

Such a recording head 1 is mounted on an ink jet type recording apparatus I. FIG. 12 is a schematic diagram showing an example of the ink jet type recording apparatus of the embodiment.

In the ink jet type recording apparatus I shown in FIG. 12, the recording head 1 is detachably provided with a cartridge 2 forming liquid supply means, and a carriage 3 on which the recording head 1 is mounted is provided so as to be movable in the axial direction on a carriage shaft 5 attached to an apparatus body 4.

A driving force of a driving motor 6 is transmitted to the carriage 3 via a plurality of gears (not shown) and a timing belt 7, so that the carriage 3 on which the recording head 1 is mounted is moved along the carriage shaft 5. On the other hand, the apparatus body 4 is provided with a transport roller 8 as transport means, and a recording sheet S which is a recording medium such as paper is transported by the transport roller 8. The transport means transporting the recording sheet S is not limited to the transport roller, and may be a belt, a drum, or the like.

In addition, in the above-described example, the inkjet recording apparatus I has a configuration in which the cartridge 2 as ink supply means is mounted on the carriage 3, and the invention is not particularly limited thereto. For example, a liquid supply means such as an ink tank may be fixed to the apparatus body 4, and the liquid supply means and the recording head 1 may be connected via a supply pipe such as a tube. In addition, the liquid supply means may not be mounted on the ink jet type recording apparatus.

Furthermore, in the ink jet type recording apparatus I described above, an example in which the recording head 1 is mounted on the carriage 3 and moves in a main scanning direction is exemplified, and the invention is not particularly limited thereto. For example, the invention can also be applied to a so-called line type recording apparatus in which the recording head 1 is fixed and printing is performed by simply moving the recording sheet S such as paper in a sub-scanning direction.

In addition, the invention broadly covers the liquid ejecting head in general, and can also be applied to a recording head such as various ink jet recording heads used in an image recording apparatus such as a printer, a color material ejecting head used in manufacturing a color filter such as a liquid crystal display, an electrode material ejecting head used in forming an electrode of an organic EL display, an field emission display (FED), a bioorganic material ejecting head used in manufacturing a bio chip, and the like. In addition, the ink jet type recording apparatus I is described as an example of a liquid ejecting apparatus, it can also be used for a liquid ejecting apparatus using other liquid ejecting heads described above.

In addition, the invention is not limited to the liquid ejecting head, and can also be applied to other piezoelectric devices having a substrate provided with a recessed portion and a piezoelectric actuator. Examples of other piezoelectric devices include an ultrasonic device such as an ultrasonic transmitter, an ultrasonic motor, a temperature-electric converter, a pressure-electric converter, a ferroelectric transistor, a piezoelectric transformer, a filter such as a filter for blocking harmful rays such as infrared rays, an optical filter using a photonic crystal effect by forming quantum dots, and an optical filter using optical interference of a thin film, various sensors such as an infrared sensor, an ultrasonic sensor, a thermal sensor, a pressure sensor, a pyroelectric sensor, and a gyro sensor (angular velocity sensor), a ferroelectric memory, and the like.

What is claimed is:
1. A piezoelectric device comprising:
a substrate on which a plurality of first recessed portions are formed;
a vibration plate that is provided on one surface side of the substrate and has a zirconium oxide layer containing zirconium oxide as an uppermost layer on a side opposite to the substrate; and
a piezoelectric element that has a first electrode provided on the one surface side of the substrate via the vibration plate, a piezoelectric layer provided on the first electrode, and a second electrode provided on the piezoelectric layer,
wherein in the piezoelectric element, an active portion of the piezoelectric layer interposed between the first electrode and the second electrode is provided independently for each of the first recessed portions,
the first electrode forms an individual electrode provided independently for each of the active portions,
the second electrode forms a common electrode commonly provided to a plurality of the active portions,
in the piezoelectric layer, a second recessed portion which is provided outside the active portion and opens on the side opposite to the substrate is provided,
in a lamination direction of the substrate and the piezoelectric element, a first barrier layer formed of a material other than the zirconium oxide is formed in a region of the vibration plate opposite to the substrate and overlapping a bottom surface of the second recessed portion,
the first barrier layer is not formed in a portion of a region overlapping the active portion in the lamination direction, and
the first barrier layer provided in the region overlapping the bottom surface of the second recessed portion in the lamination direction is sandwiched between the vibration plate and the second electrode.
2. The piezoelectric device according to claim 1,
wherein the plurality of the active portions are disposed in parallel in a first direction, and
the second recessed portions are provided on both sides of the active portion in the first direction.
3. A liquid ejecting head comprising:
the piezoelectric device according to claim 2.
4. The piezoelectric device according to claim 1,
wherein in the lamination direction, the second recessed portion and the first recessed portion are disposed on at least a position partially overlapping each other.
5. A liquid ejecting head comprising:
the piezoelectric device according to claim 4.
6. The piezoelectric device according to claim 1,
wherein the first barrier layer extends from the region overlapping the bottom surface of the second recessed portion toward the active portion side in the lamination direction.
7. The piezoelectric device according to claim 6,
wherein a portion of the first barrier layer extending toward the active portion side is provided between the piezoelectric layer and the second electrode.
8. A liquid ejecting head comprising:
the piezoelectric device according to claim 7.
9. The piezoelectric device according to claim 6,
wherein a portion of the first barrier layer extending toward the active portion side is provided between the vibration plate and the piezoelectric layer.
10. The piezoelectric device according to claim 9,
wherein the first barrier layer is formed of a metal.
11. A liquid ejecting head comprising:
the piezoelectric device according to claim 6.
12. The piezoelectric device according to claim 1,
wherein the first barrier layer has an amorphous oxide film or a nitride film.
13. The piezoelectric device according to claim 1,
wherein the second recessed portion is provided so as to penetrate the piezoelectric layer in the lamination direction, and
at the bottom surface of the second recessed portion, the vibration plate, the first barrier layer, and the second electrode are laminated in this order from the substrate side.
14. The piezoelectric device according to claim 1,
wherein a second barrier layer formed of a material different from that of the first barrier layer is provided between the piezoelectric layer of the active portion and the second electrode.

15. The piezoelectric device according to claim 14,
wherein in the lamination direction, the first barrier layer and the second barrier layer are disposed on at least a position partially overlapping each other.

16. The piezoelectric device according to claim 14,
wherein the second barrier layer is formed of a metal.

17. A liquid ejecting head comprising:
the piezoelectric device according to claim 1.

18. A liquid ejecting apparatus comprising:
the liquid ejecting head according to claim 17.

19. The piezoelectric device according to claim 1, wherein, in a region that does not overlap the bottom surface of the second recessed portion in the lamination direction, the first barrier layer overlaps the piezoelectric layer in the lamination direction, and the first barrier layer is sandwiched between the piezoelectric layer and the second electrode.

* * * * *